U S009899056B1

(12) United States Patent
Tretter et al.

(10) Patent No.: US 9,899,056 B1
(45) Date of Patent: Feb. 20, 2018

(54) IN-CIRCUIT CALIBRATION OF ANTI-ALIASING FILTER

(71) Applicant: International Business Machines Corporation, Armonk, NY (US)

(72) Inventors: Larry L. Tretter, Tucson, AZ (US); Matthew M. Viens, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/603,177

(22) Filed: May 23, 2017

Related U.S. Application Data

(63) Continuation of application No. 15/239,709, filed on Aug. 17, 2016, now Pat. No. 9,734,861.

(51) Int. Cl.
| | |
|---|---|
| *G11B 5/09* | (2006.01) |
| *G11B 20/10* | (2006.01) |
| *H03M 1/12* | (2006.01) |
| *H03G 3/20* | (2006.01) |
| *H03H 7/01* | (2006.01) |
| *G11B 5/008* | (2006.01) |

(52) U.S. Cl.
CPC .... *G11B 20/10046* (2013.01); *G11B 5/00813* (2013.01); *H03G 3/20* (2013.01); *H03H 7/0161* (2013.01); *H03M 1/124* (2013.01)

(58) Field of Classification Search
CPC . G11B 20/10009; G11B 5/09; G11B 2220/90; G11B 20/1426; G11B 20/1411; G11B 20/1403
USPC .................................. 360/39, 40, 43, 45, 51
See application file for complete search history.

(56) References Cited

U.S. PATENT DOCUMENTS

| | | | |
|---|---|---|---|
| 6,492,922 B1 | 12/2002 | New | |
| 6,906,985 B2 | 6/2005 | Kadlec et al. | |
| 7,230,782 B2* | 6/2007 | Norton, Jr. | G11B 5/584 360/39 |
| 8,391,628 B2 | 3/2013 | Huang et al. | |
| 8,391,822 B2 | 3/2013 | Lim et al. | |
| 9,734,861 B1 | 8/2017 | Tretter et al. | |

(Continued)

FOREIGN PATENT DOCUMENTS

WO    2011063461 A1    6/2011

OTHER PUBLICATIONS

Tretter et al., U.S. Appl. No. 15/239,709, filed Aug. 17, 2016.

(Continued)

*Primary Examiner* — Nabil Hindi
(74) *Attorney, Agent, or Firm* — Zilka-Kotab, P.C.

(57) ABSTRACT

A computer-implemented method, according to one embodiment, includes, performing anti-aliasing filtering on each of a plurality of symmetrical square wave signals, each symmetrical square wave signal having a frequency that is a different fraction of a frequency of a data read clock. The filtered symmetrical square wave signals are passed through a band pass filter. An amplitude of each of the symmetrical square wave signals is measured after the band pass filtering. In response to the amplitudes of the symmetrical square wave signals being within a predefined range, anti-aliasing settings used during the anti-aliasing filtering are stored. In response to the amplitudes of the symmetrical square wave signals being outside the predefined range, the anti-aliasing settings are changed.

20 Claims, 13 Drawing Sheets

(56) References Cited

U.S. PATENT DOCUMENTS

2008/0175506 A1 7/2008 Ota
2016/0050024 A1 2/2016 Kaneda

OTHER PUBLICATIONS

List of IBM Patents or Patent Applications Treated As Related.
Keller et al., "On the Implicit Anti-Aliasing Feature of Continuous-Time Cascaded Sigma-Delta Modulators," IEEE Transactions on Circuits and Systems, vol. 54, No. 12, Dec. 2007, pp. 2639-2645.
Notice of Allowance from U.S. Appl. No. 15/239,709, dated Mar. 20, 2017.
Tretter et al., U.S. Appl. No. 15/807,484, filed Nov. 8, 2017.

* cited by examiner

IN-CIRCUIT CALIBRATION OF ANTI-ALIASING FILTER

BACKGROUND

The present invention relates to signal processing circuits, and more particularly, this invention relates to calibration of anti-aliasing filters in signal processing circuits.

In systems that process analog signals in part in the digital domain, it is often desirable to limit the frequency components of the input signal before sampling by an analog to digital convertor (ADC) to some fraction of the sample frequency, e.g., less than ½ the sample frequency. Any input frequency components to the ADC above the fraction of the sample rate (e.g., above ½ the sample rate) are reflected below the fraction of the sample rate (e.g., below ½ the sample rate) after recovering the analog signal using a digital to analog converter (DAC) positioned downstream of the ADC output. For this reason, it is important to control the cutoff frequency of the low pass Anti-Aliasing (AA) filter in the analog domain. At the same time, it is desirable to have a simple analog AA filter design.

In magnetic storage systems, magnetic transducers read data from and write data onto magnetic recording media. Data is written on the magnetic recording media by moving a magnetic recording transducer to a position over the media where the data is to be stored. The magnetic recording transducer then generates a magnetic field, which encodes the data into the magnetic media. Data is read from the media by similarly positioning the magnetic read transducer and then sensing the magnetic field of the magnetic media. Read and write operations may be independently synchronized with the movement of the media to ensure that the data can be read from and written to the desired location on the media. Data read from the media is typically processed in a read channel that processes an analog signal derived from a read transducer and outputs a digital signal.

SUMMARY

A computer-implemented method, according to one embodiment, includes, performing anti-aliasing filtering on each of a plurality of symmetrical square wave signals, each symmetrical square wave signal having a frequency that is a different fraction of a frequency of a data read clock. The filtered symmetrical square wave signals are passed through a band pass filter. An amplitude of each of the symmetrical square wave signals is measured after the band pass filtering. In response to the amplitudes of the symmetrical square wave signals being within a predefined range, anti-aliasing settings used during the anti-aliasing filtering are stored. In response to the amplitudes of the symmetrical square wave signals being outside the predefined range, the anti-aliasing settings are changed.

A computer program product for calibrating an anti-aliasing filter, according to one embodiment, includes a computer readable storage medium having program instructions embodied therewith. The computer readable storage medium is not a transitory signal per se. The program instructions are executable by a processing circuit to cause the processing circuit to perform the foregoing method.

Any of these embodiments may be implemented in a magnetic data storage system such as a tape drive system, which may include a magnetic head, a drive mechanism for passing a magnetic medium (e.g., recording tape) over the magnetic head, and a controller electrically coupled to the magnetic head.

Other aspects and embodiments of the present invention will become apparent from the following detailed description, which, when taken in conjunction with the drawings, illustrate by way of example the principles of the invention.

DETAILED DESCRIPTION

Figure 1A:
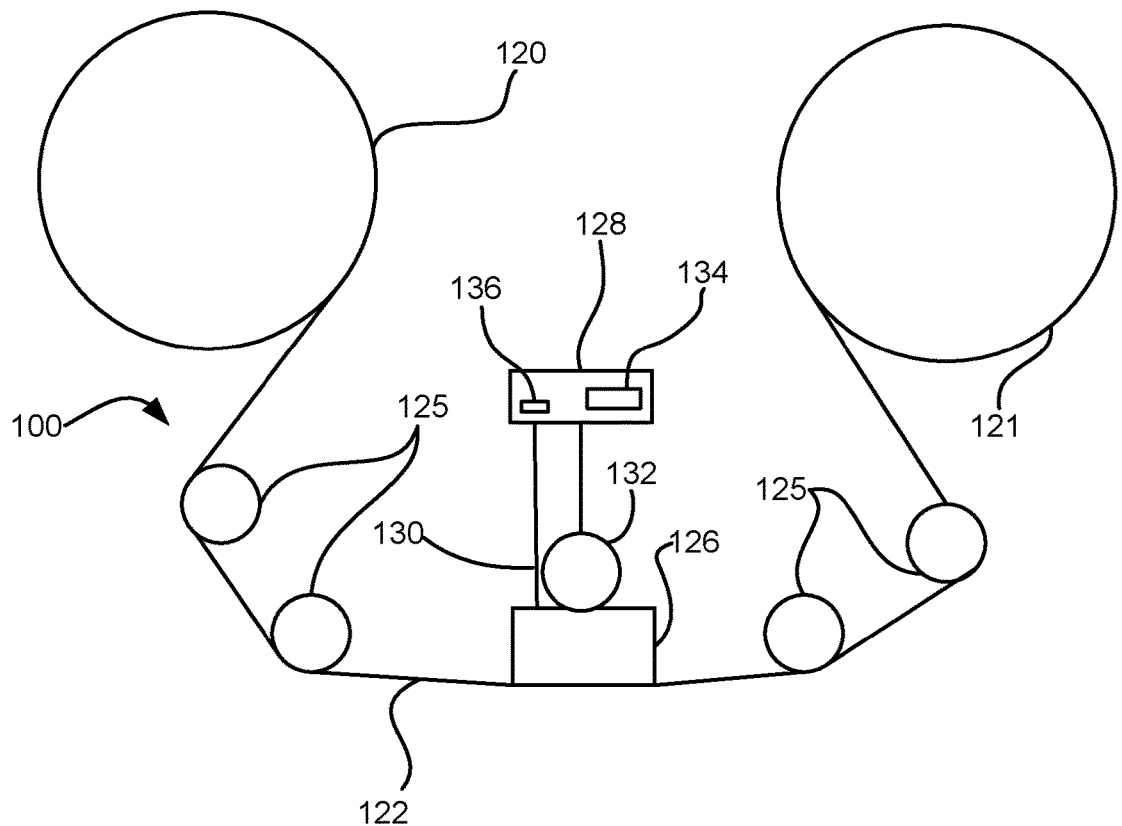
FIG. 1A is a schematic diagram of a simplified tape drive system according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of signal processing systems, as well as operation and/or component parts thereof. Preferred embodiments use a simple AA filter design while providing requisite accuracy in the AA filter. In preferred embodiments, the tolerance of an analog AA filter is improved by reconfiguring components in an analog-digital signal processing channel to allow calibration of the AA filter by measuring the amplitude at different frequencies.

The circuits, algorithms, firmware, etc. described herein may be implemented in any type of signal processing system. Such systems may be usable in any of a plethora of technologies, including but not limited to data channel decoding e.g., of a magnetic or optical drive; networking; wireless communications; etc.

By way of example only, and solely to place the concepts presented herein in a context to aid the reader, various embodiments will be presented in the context of a magnetic read channel. Again, this is done by way of example only and is not intended to limit any of the embodiments presented herein to any of the specific examples presented herein.

In one general embodiment, a computer-implemented method includes, for a particular data read clock value, generating a series of symmetrical square wave signals, each symmetrical square wave signal having a frequency that is a different fraction of the data read clock frequency. The method also includes performing anti-aliasing filtering on each of the symmetrical square wave signals using predefined anti-aliasing settings. The filtered symmetrical square wave signals are passed through a band pass filter, the band pass filter being set to pass a single harmonic frequency of each of the symmetrical square wave signals. An amplitude of each of the symmetrical square wave signals is measured after the band pass filtering. In response to the amplitudes of the symmetrical square wave signals being within a predefined range, the anti-aliasing settings are stored. In response to the amplitudes of the symmetrical square wave signals being outside the predefined range, the anti-aliasing settings are changed, and the method is repeated.

In another general embodiment, a computer program product for calibrating an anti-aliasing filter includes a computer readable storage medium having program instructions embodied therewith. The computer readable storage medium is not a transitory signal per se. The program instructions are executable by a processing circuit to cause the processing circuit to perform the foregoing method.

FIG. 1A illustrates a simplified tape drive 100 of a tape-based data storage system, which may be employed in the context of the present invention. While one specific implementation of a tape drive is shown in FIG. 1A, it should be noted that the embodiments described herein may be implemented in the context of any type of tape drive system.

As shown, a tape supply cartridge 120 and a take-up reel 121 are provided to support a tape 122. One or more of the reels may form part of a removable cartridge and are not necessarily part of the system 100. The tape drive, such as that illustrated in FIG. 1A, may further include drive motor(s) to drive the tape supply cartridge 120 and the take-up reel 121 to move the tape 122 over a tape head 126 of any type. Such head may include an array of readers, writers, or both.

Guides 125 guide the tape 122 across the tape head 126. Such tape head 126 is in turn coupled to a controller 128 via a cable 130. The controller 128, may be or include a processor and/or any logic for controlling any subsystem of the drive 100. For example, the controller 128 typically controls head functions such as servo following, data writing, data reading, etc. The controller 128 may include at least one servo channel and at least one data channel, each of which include data flow processing logic configured to process and/or store information to be written to and/or read from the tape 122. The controller 128 may operate under logic known in the art, as well as any logic disclosed herein, and thus may be considered as a processor for any of the descriptions of tape drives included herein, in various embodiments. The controller 128 may be coupled to a memory 136 of any known type, which may store instructions executable by the controller 128. Moreover, the controller 128 may be configured and/or programmable to perform or control some or all of the methodology presented herein. Thus, the controller 128 may be considered to be configured to perform various operations by way of logic programmed into one or more chips, modules, and/or blocks; software, firmware, and/or other instructions being available to one or more processors; etc., and combinations thereof.

The cable 130 may include read/write circuits to transmit data to the head 126 to be recorded on the tape 122 and to receive data read by the head 126 from the tape 122. An actuator 132 controls position of the head 126 relative to the tape 122.

An interface 134 may also be provided for communication between the tape drive 100 and a host (internal or external) to send and receive the data and for controlling the operation of the tape drive 100 and communicating the status of the tape drive 100 to the host, all as will be understood by those of skill in the art.

Figure 1B:
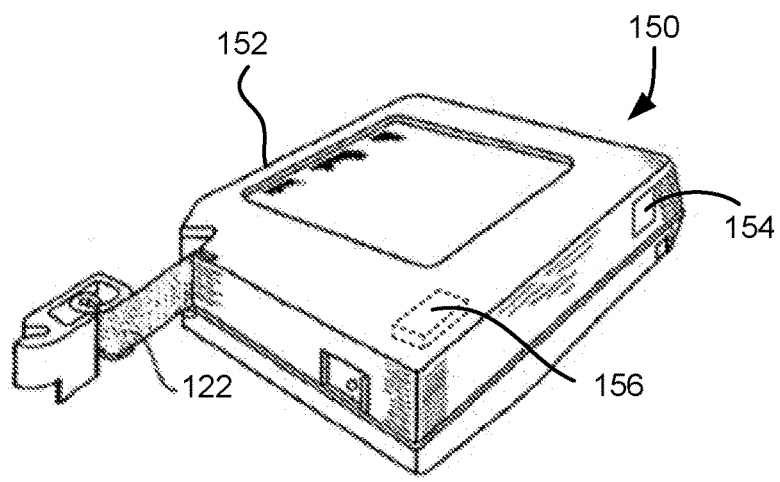
FIG. 1B is a schematic diagram of a tape cartridge according to one embodiment.

FIG. 1B illustrates an exemplary tape cartridge 150 according to one embodiment. Such tape cartridge 150 may be used with a system such as that shown in FIG. 1A. As shown, the tape cartridge 150 includes a housing 152, a tape 122 in the housing 152, and a nonvolatile memory 156 coupled to the housing 152. In some approaches, the nonvolatile memory 156 may be embedded inside the housing 152, as shown in FIG. 1B. In more approaches, the nonvolatile memory 156 may be attached to the inside or outside of the housing 152 without modification of the housing 152. For example, the nonvolatile memory may be embedded in a self-adhesive label 154. In one preferred embodiment, the nonvolatile memory 156 may be a Flash memory device, ROM device, etc., embedded into or coupled to the inside or outside of the tape cartridge 150. The nonvolatile memory is accessible by the tape drive and the tape operating software (the driver software), and/or another device.

Figure 2:
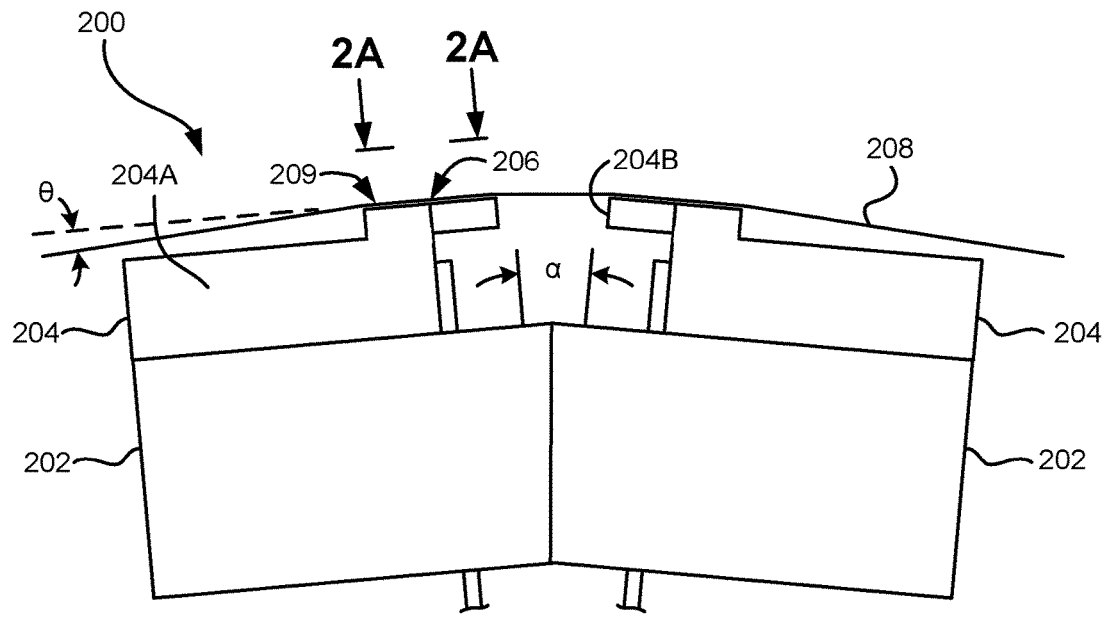
FIG. 2 illustrates a side view of a flat-lapped, bi-directional, two-module magnetic tape head according to one embodiment.

By way of example, FIG. 2 illustrates a side view of a flat-lapped, bi-directional, two-module magnetic tape head 200 which may be implemented in the context of the present invention. As shown, the head includes a pair of bases 202, each equipped with a module 204, and fixed at a small angle α with respect to each other. The bases may be "U-beams" that are adhesively coupled together. Each module 204 includes a substrate 204A and a closure 204B with a thin film portion, commonly referred to as a "gap" in which the readers and/or writers 206 are formed. In use, a tape 208 is moved over the modules 204 along a media (tape) bearing surface 209 in the manner shown for reading and writing data on the tape 208 using the readers and writers. The wrap angle θ of the tape 208 at edges going onto and exiting the flat media support surfaces 209 are usually between about 0.1 degree and about 3 degrees.

The substrates 204A are typically constructed of a wear resistant material, such as a ceramic. The closures 204B may be made of the same or similar ceramic as the substrates 204A.

The readers and writers may be arranged in a piggyback or merged configuration. An illustrative piggybacked configuration comprises a (magnetically inductive) writer transducer on top of (or below) a (magnetically shielded) reader transducer (e.g., a magnetoresistive reader, etc.), wherein the poles of the writer and the shields of the reader are generally separated. An illustrative merged configuration comprises one reader shield in the same physical layer as one writer pole (hence, "merged"). The readers and writers may also be arranged in an interleaved configuration. Alternatively, each array of channels may be readers or writers only. Any of these arrays may contain one or more servo track readers for reading servo data on the medium.

Figure 2A:
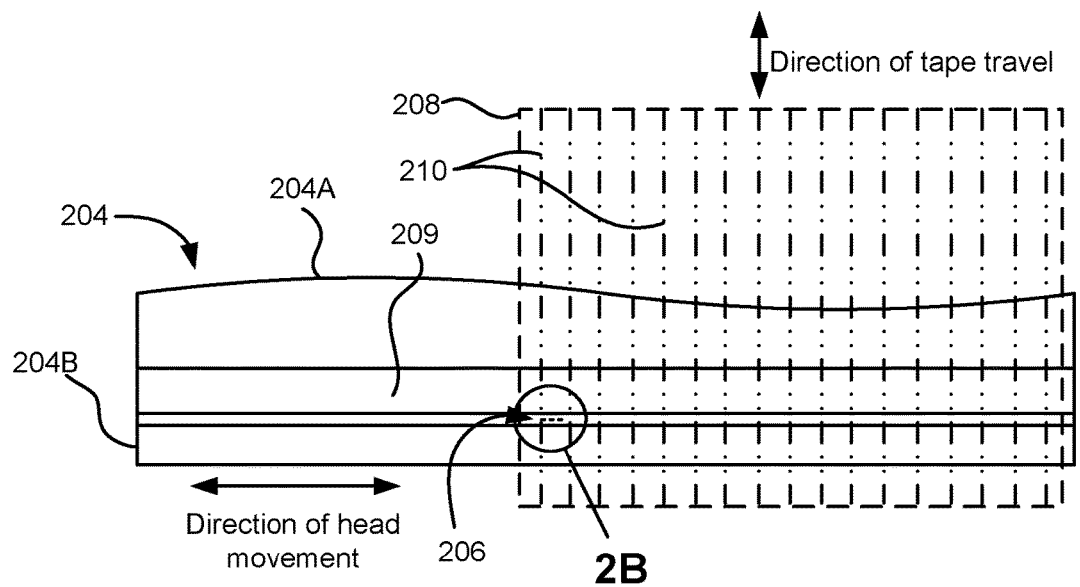
FIG. 2A is a tape bearing surface view taken from Line 2A of FIG. 2.

FIG. 2A illustrates the tape bearing surface 209 of one of the modules 204 taken from Line 2A of FIG. 2. A representative tape 208 is shown in dashed lines. The module 204 is preferably long enough to be able to support the tape as the head steps between data bands.

In this example, the tape 208 includes 4 to 32 data bands, e.g., with 16 data bands and 17 servo tracks 210, as shown in FIG. 2A on a one-half inch wide tape 208. The data bands are defined between servo tracks 210. Each data band may include a number of data tracks, for example 1024 data tracks (not shown). During read/write operations, the readers and/or writers 206 are positioned to specific track positions within one of the data bands. Outer readers, sometimes called servo readers, read the servo tracks 210. The servo signals are in turn used to keep the readers and/or writers 206 aligned with a particular set of tracks during the read/write operations.

Figure 2B:
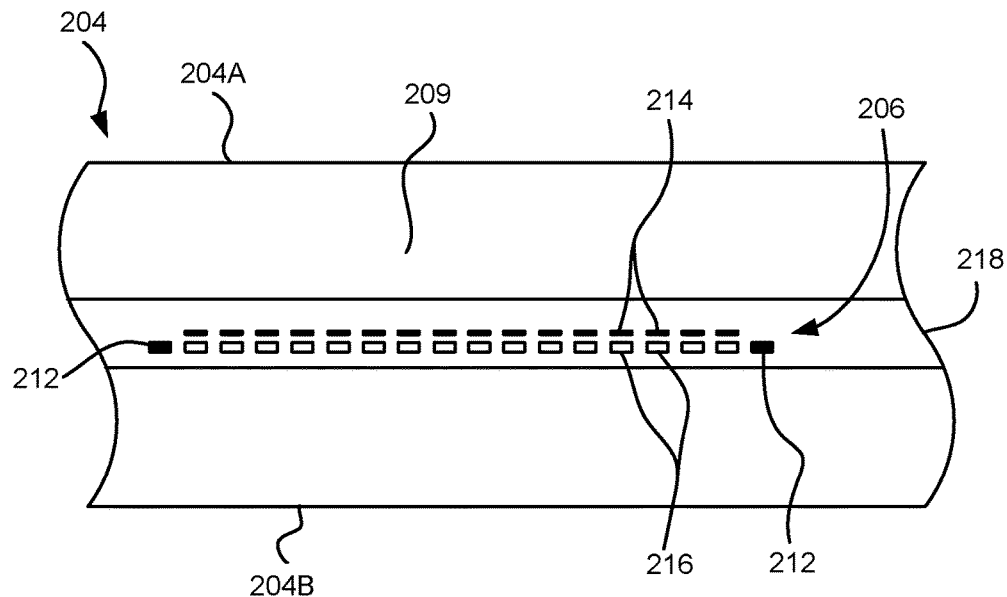
FIG. 2B is a detailed view taken from Circle 2B of FIG. 2A.

FIG. 2B depicts a plurality of readers and/or writers 206 formed in a gap 218 on the module 204 in Circle 2B of FIG. 2A. As shown, the array of readers and writers 206 includes, for example, 16 writers 214, 16 readers 216 and two servo readers 212, though the number of elements may vary. Illustrative embodiments include 8, 16, 32, 40, and 64 active readers and/or writers 206 per array, and alternatively interleaved designs having odd numbers of reader or writers such as 17, 25, 33, etc. An illustrative embodiment includes 32 readers per array and/or 32 writers per array, where the actual number of transducer elements could be greater, e.g., 33, 34, etc. This allows the tape to travel more slowly, thereby reducing speed-induced tracking and mechanical difficulties and/or execute fewer "wraps" to fill or read the tape. While the readers and writers may be arranged in a piggyback configuration as shown in FIG. 2B, the readers 216 and writers 214 may also be arranged in an interleaved configuration. Alternatively, each array of readers and/or writers 206 may be readers or writers only, and the arrays may contain one or more servo readers 212. As noted by considering FIGS. 2 and 2A-B together, each module 204 may include a complementary set of readers and/or writers 206 for such things as bi-directional reading and writing, read-while-write capability, backward compatibility, etc.

Figure 2C:
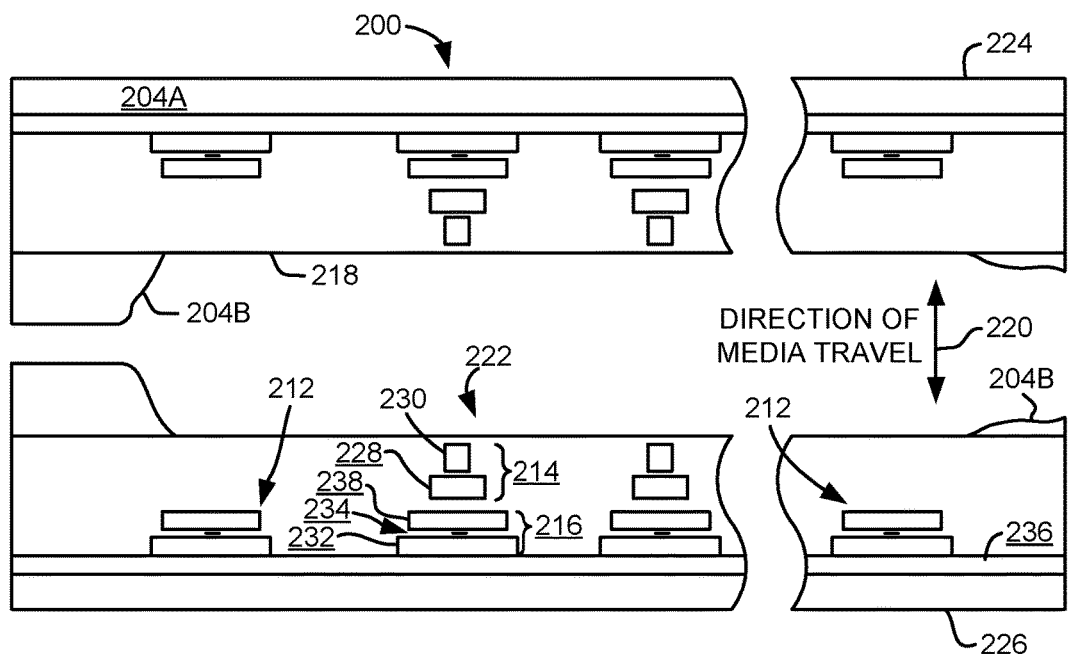
FIG. 2C is a detailed view of a partial tape bearing surface of a pair of modules.

FIG. 2C shows a partial tape bearing surface view of complementary modules of a magnetic tape head 200 according to one embodiment. In this embodiment, each module has a plurality of read/write (R/W) pairs in a piggyback configuration formed on a common substrate 204A and an optional electrically insulative layer 236. The writers, exemplified by the write transducer 214 and the readers, exemplified by the read transducer 216, are aligned parallel to an intended direction of travel of a tape medium thereacross to form an R/W pair, exemplified by the R/W pair 222. Note that the intended direction of tape travel is sometimes referred to herein as the direction of tape travel, and such terms may be used interchangeably. Such direction of tape travel may be inferred from the design of the system, e.g., by examining the guides; observing the actual direction of tape travel relative to the reference point; etc. Moreover, in a system operable for bi-direction reading and/or writing, the direction of tape travel in both directions is typically parallel and thus both directions may be considered equivalent to each other.

Several R/W pairs 222 may be present, such as 8, 16, 32 pairs, etc. The R/W pairs 222 as shown are linearly aligned in a direction generally perpendicular to a direction of tape travel thereacross. However, the pairs may also be aligned diagonally, etc. Servo readers 212 are positioned on the outside of the array of R/W pairs, the function of which is well known.

Generally, the magnetic tape medium moves in either a forward or reverse direction as indicated by arrow 220. The magnetic tape medium and head assembly 200 operate in a transducing relationship in the manner well-known in the art. The piggybacked MR head assembly 200 includes two thin-film modules 224 and 226 of generally identical construction.

Modules 224 and 226 are joined together with a space present between closures 204B thereof (partially shown) to form a single physical unit to provide read-while-write capability by activating the writer of the leading module and reader of the trailing module aligned with the writer of the leading module parallel to the direction of tape travel relative thereto. When a module 224, 226 of a piggyback head 200 is constructed, layers are formed in the gap 218 created above an electrically conductive substrate 204A (partially shown), e.g., of AlTiC, in generally the following order for the R/W pairs 222: an insulating layer 236, a first shield 232 typically of an iron alloy such as NiFe (-), cobalt zirconium tantalum (CZT) or Al—Fe—Si (Sendust), a sensor 234 for sensing a data track on a magnetic medium, a second shield 238 typically of a nickel-iron alloy (e.g., ~80/20 at % NiFe, also known as permalloy), first and second writer pole tips 228, 230, and a coil (not shown). The sensor may be of any known type, including those based on MR, GMR, AMR, tunneling magnetoresistance (TMR), etc.

The first and second writer poles 228, 230 may be fabricated from high magnetic moment materials such as ~45/55 NiFe. Note that these materials are provided by way of example only, and other materials may be used. Additional layers such as insulation between the shields and/or pole tips and an insulation layer surrounding the sensor may be present. Illustrative materials for the insulation include alumina and other oxides, insulative polymers, etc.

Figure 4:
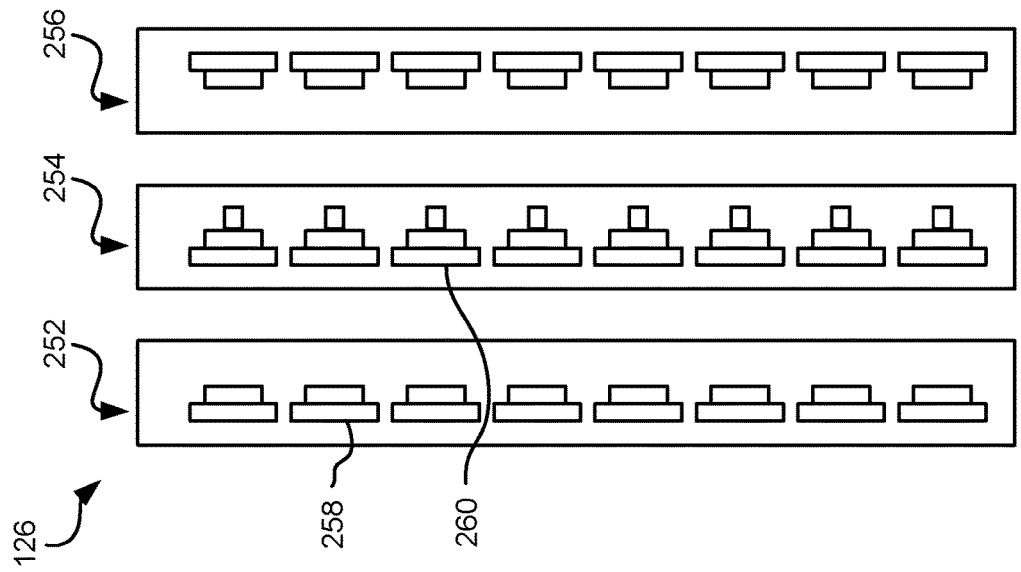
FIG. 4 is a partial tape bearing surface view of a magnetic head having a read-write-read configuration.
Figure 3:
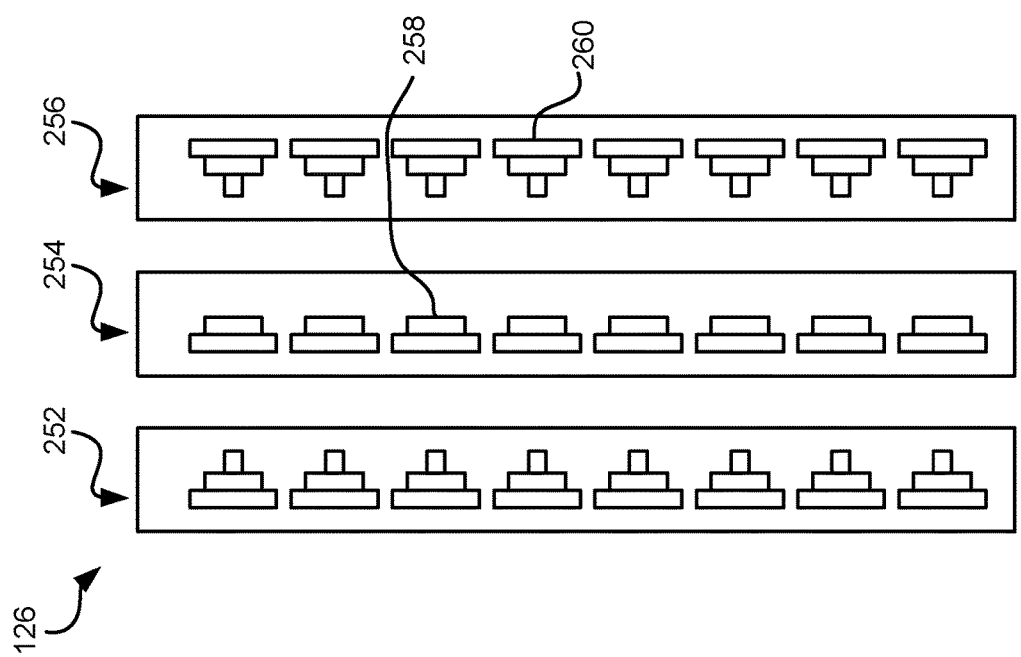
FIG. 3 is a partial tape bearing surface view of a magnetic head having a write-read-write configuration.

The configuration of the tape head 126 according to one embodiment includes multiple modules, preferably three or more. In a write-read-write (W-R-W) head, outer modules for writing flank one or more inner modules for reading. Referring to FIG. 3, depicting a W-R-W configuration, the outer modules 252, 256 each include one or more arrays of writers 260. The inner module 254 of FIG. 3 includes one or more arrays of readers 258 in a similar configuration. Variations of a multi-module head include a R-W-R head (FIG. 4), a R-R-W head, a W-W-R head, etc. In yet other variations, one or more of the modules may have read/write pairs of transducers. Moreover, more than three modules may be present. In further approaches, two outer modules may flank two or more inner modules, e.g., in a W-R-R-W, a R-W-W-R arrangement, etc. For simplicity, a W-R-W head is used primarily herein to exemplify embodiments of the present invention. One skilled in the art apprised with the teachings herein will appreciate how permutations of the present invention would apply to configurations other than a W-R-W configuration.

Figure 5:
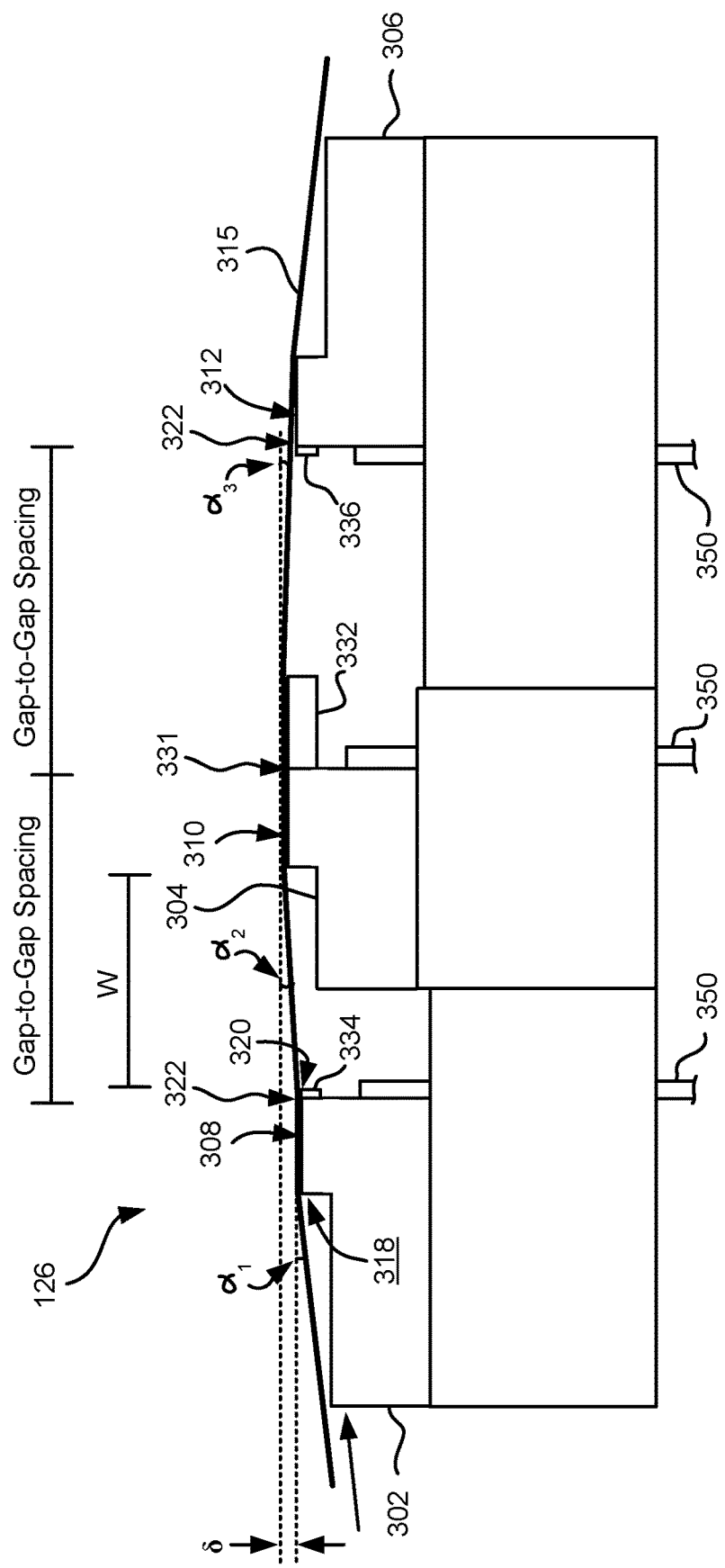
FIG. 5 is a side view of a magnetic tape head with three modules according to one embodiment where the modules all generally lie along about parallel planes.

FIG. 5 illustrates a magnetic head 126 according to one embodiment of the present invention that includes first, second and third modules 302, 304, 306 each having a tape bearing surface 308, 310, 312 respectively, which may be flat, contoured, etc. Note that while the term "tape bearing surface" appears to imply that the surface facing the tape 315 is in physical contact with the tape bearing surface, this is not necessarily the case. Rather, only a portion of the tape may be in contact with the tape bearing surface, constantly or intermittently, with other portions of the tape riding (or "flying") above the tape bearing surface on a layer of air, sometimes referred to as an "air bearing". The first module 302 will be referred to as the "leading" module as it is the first module encountered by the tape in a three module design for tape moving in the indicated direction. The third module 306 will be referred to as the "trailing" module. The trailing module follows the middle module and is the last module seen by the tape in a three module design. The leading and trailing modules 302, 306 are referred to collectively as outer modules. Also note that the outer modules 302, 306 will alternate as leading modules, depending on the direction of travel of the tape 315.

Figure 6:
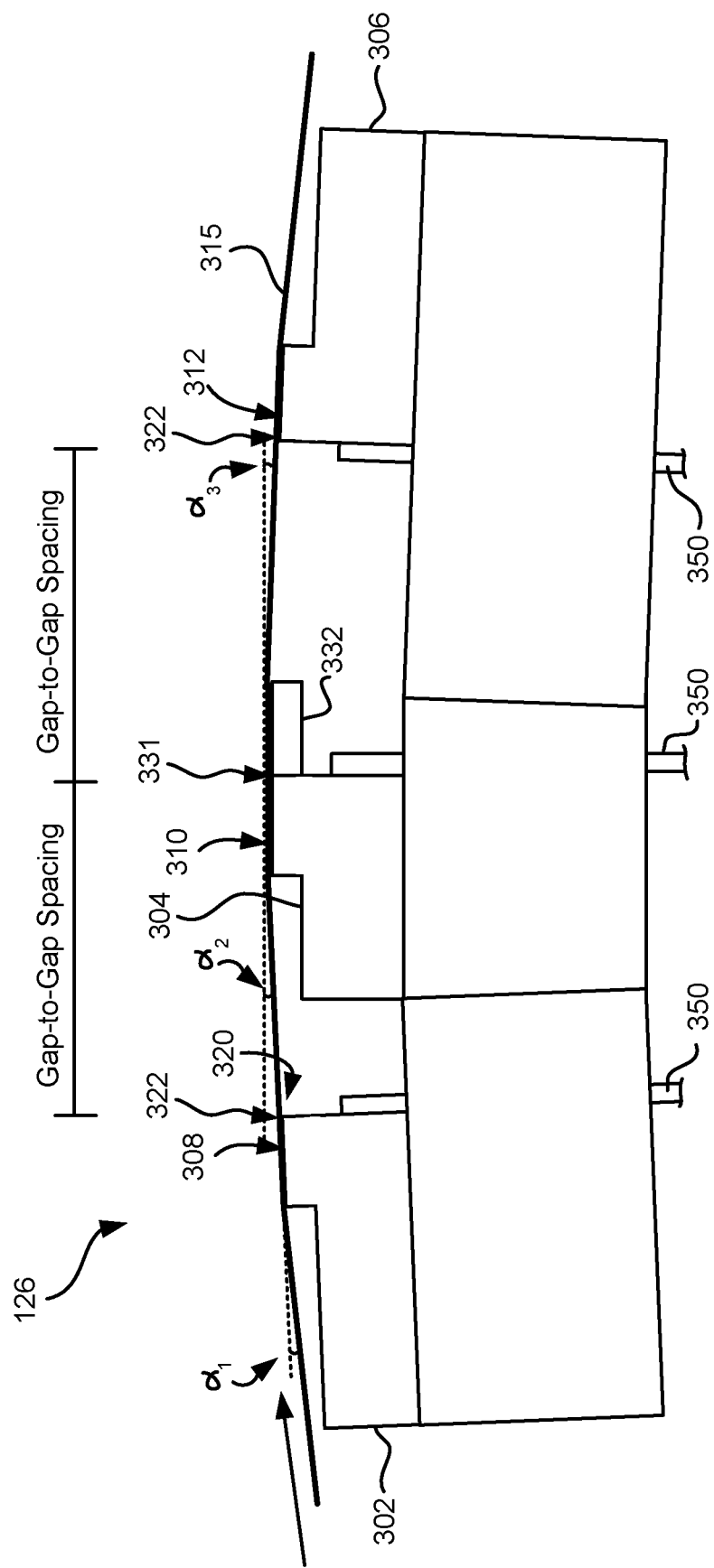
FIG. 6 is a side view of a magnetic tape head with three modules in a tangent (angled) configuration.

In one embodiment, the tape bearing surfaces 308, 310, 312 of the first, second and third modules 302, 304, 306 lie on about parallel planes (which is meant to include parallel and nearly parallel planes, e.g., between parallel and tangential as in FIG. 6), and the tape bearing surface 310 of the second module 304 is above the tape bearing surfaces 308, 312 of the first and third modules 302, 306. As described below, this has the effect of creating the desired wrap angle $\alpha_2$ of the tape relative to the tape bearing surface 310 of the second module 304.

Where the tape bearing surfaces 308, 310, 312 lie along parallel or nearly parallel yet offset planes, intuitively, the tape should peel off of the tape bearing surface 308 of the leading module 302. However, the vacuum created by the skiving edge 318 of the leading module 302 has been found by experimentation to be sufficient to keep the tape adhered to the tape bearing surface 308 of the leading module 302. The trailing edge 320 of the leading module 302 (the end from which the tape leaves the leading module 302) is the approximate reference point which defines the wrap angle $\alpha_2$ over the tape bearing surface 310 of the second module 304. The tape stays in close proximity to the tape bearing surface until close to the trailing edge 320 of the leading module 302. Accordingly, read and/or write elements 322 may be located near the trailing edges of the outer modules 302, 306. These embodiments are particularly adapted for write-read-write applications.

A benefit of this and other embodiments described herein is that, because the outer modules 302, 306 are fixed at a determined offset from the second module 304, the inner wrap angle $\alpha_2$ is fixed when the modules 302, 304, 306 are coupled together or are otherwise fixed into a head. The inner wrap angle $\alpha_2$ is approximately $\tan^{-1}(\delta/W)$ where $\delta$ is the height difference between the planes of the tape bearing surfaces 308, 310 and W is the width between the opposing ends of the tape bearing surfaces 308, 310. An illustrative inner wrap angle $\alpha_2$ is in a range of about 0.3° to about 1.1°, though can be any angle required by the design.

Beneficially, the inner wrap angle $\alpha_2$ on the side of the module 304 receiving the tape (leading edge) will be larger than the inner wrap angle $\alpha_3$ on the trailing edge, as the tape 315 rides above the trailing module 306. This difference is generally beneficial as a smaller $\alpha_3$ tends to oppose what has heretofore been a steeper exiting effective wrap angle.

Note that the tape bearing surfaces 308, 312 of the outer modules 302, 306 are positioned to achieve a negative wrap angle at the trailing edge 320 of the leading module 302. This is generally beneficial in helping to reduce friction due to contact with the trailing edge 320, provided that proper consideration is given to the location of the crowbar region that forms in the tape where it peels off the head. This negative wrap angle also reduces flutter and scrubbing damage to the elements on the leading module 302. Further, at the trailing module 306, the tape 315 flies over the tape bearing surface 312 so there is virtually no wear on the elements when tape is moving in this direction. Particularly, the tape 315 entrains air and so will not significantly ride on the tape bearing surface 312 of the third module 306 (some contact may occur). This is permissible, because the leading module 302 is writing while the trailing module 306 is idle.

Writing and reading functions are performed by different modules at any given time. In one embodiment, the second module 304 includes a plurality of data and optional servo readers 331 and no writers. The first and third modules 302, 306 include a plurality of writers 322 and no data readers, with the exception that the outer modules 302, 306 may include optional servo readers. The servo readers may be used to position the head during reading and/or writing operations. The servo reader(s) on each module are typically located towards the end of the array of readers or writers.

By having only readers or side by side writers and servo readers in the gap between the substrate and closure, the gap length can be substantially reduced. Typical heads have piggybacked readers and writers, where the writer is formed above each reader. A typical gap is 20-35 microns. However, irregularities on the tape may tend to droop into the gap and create gap erosion. Thus, the smaller the gap is the better. The smaller gap enabled herein exhibits fewer wear related problems.

In some embodiments, the second module 304 has a closure, while the first and third modules 302, 306 do not have a closure. Where there is no closure, preferably a hard coating is added to the module. One preferred coating is diamond-like carbon (DLC).

In the embodiment shown in FIG. 5, the first, second, and third modules 302, 304, 306 each have a closure 332, 334, 336, which extends the tape bearing surface of the associated module, thereby effectively positioning the read/write elements away from the edge of the tape bearing surface. The closure 332 on the second module 304 can be a ceramic closure of a type typically found on tape heads. The closures 334, 336 of the first and third modules 302, 306, however, may be shorter than the closure 332 of the second module 304 as measured parallel to a direction of tape travel over the respective module. This enables positioning the modules closer together. One way to produce shorter closures 334, 336 is to lap the standard ceramic closures of the second module 304 an additional amount. Another way is to plate or deposit thin film closures above the elements during thin film processing. For example, a thin film closure of a hard material such as Sendust or nickel-iron alloy (e.g., 45/55) can be formed on the module.

With reduced-thickness ceramic or thin film closures 334, 336 or no closures on the outer modules 302, 306, the write-to-read gap spacing can be reduced to less than about 1 mm, e.g., about 0.75 mm, or 50% less than commonly-used LTO tape head spacing. The open space between the modules 302, 304, 306 can still be set to approximately 0.5 to 0.6 mm, which in some embodiments is ideal for stabilizing tape motion over the second module 304.

Depending on tape tension and stiffness, it may be desirable to angle the tape bearing surfaces of the outer modules relative to the tape bearing surface of the second module. FIG. 6 illustrates an embodiment where the modules 302, 304, 306 are in a tangent or nearly tangent (angled) configuration. Particularly, the tape bearing surfaces of the outer modules 302, 306 are about parallel to the tape at the desired wrap angle $\alpha_2$ of the second module 304. In other words, the planes of the tape bearing surfaces 308, 312 of the outer modules 302, 306 are oriented at about the desired wrap angle $\alpha_2$ of the tape 315 relative to the second module 304. The tape will also pop off of the trailing module 306 in this embodiment, thereby reducing wear on the elements in the trailing module 306. These embodiments are particularly useful for write-read-write applications. Additional aspects of these embodiments are similar to those given above.

Typically, the tape wrap angles may be set about midway between the embodiments shown in FIGS. 5 and 6.

Figure 7:
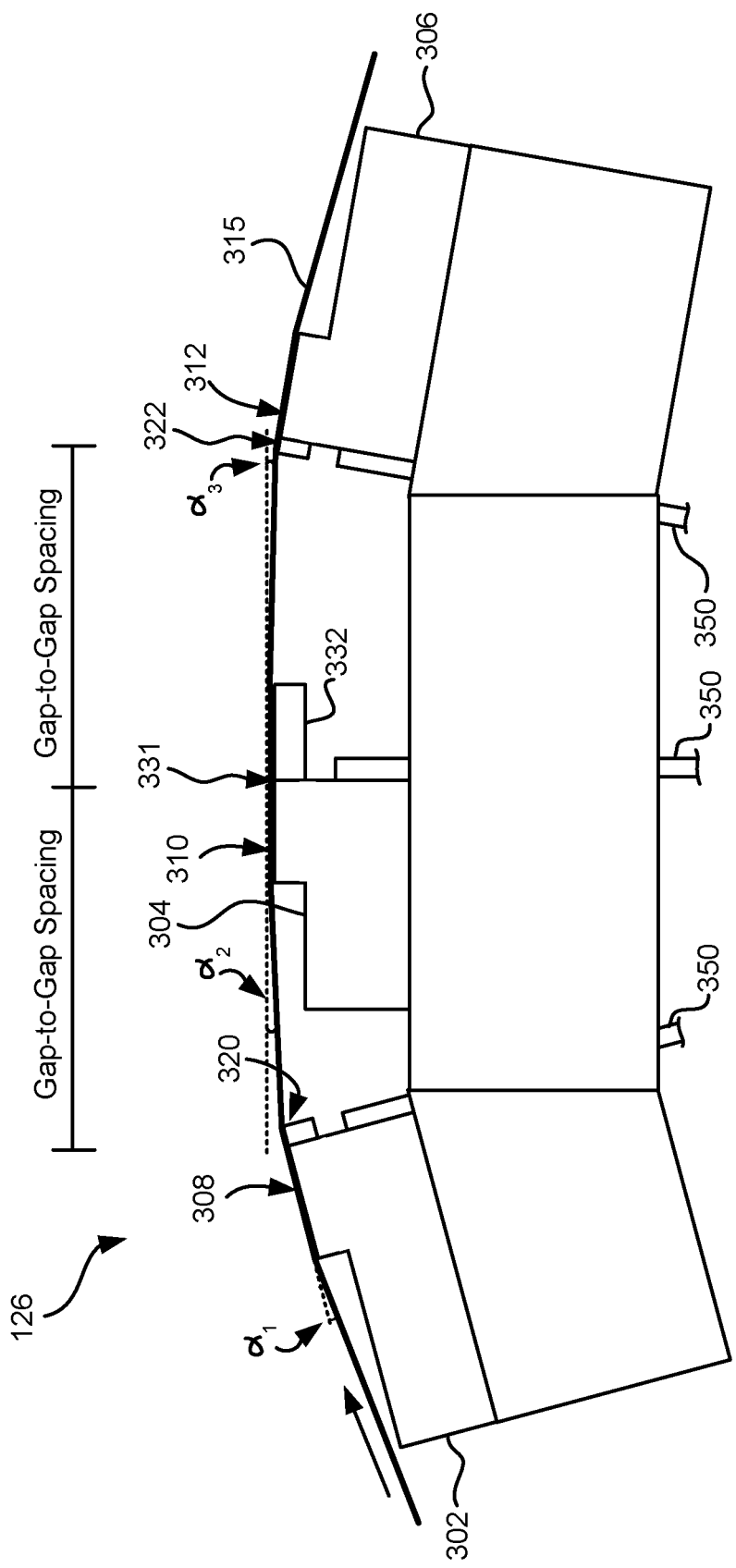
FIG. 7 is a side view of a magnetic tape head with three modules in an overwrap configuration.

FIG. 7 illustrates an embodiment where the modules 302, 304, 306 are in an overwrap configuration. Particularly, the tape bearing surfaces 308, 312 of the outer modules 302, 306 are angled slightly more than the tape 315 when set at the desired wrap angle $\alpha_2$ relative to the second module 304. In this embodiment, the tape does not pop off of the trailing module, allowing it to be used for writing or reading. Accordingly, the leading and middle modules can both perform reading and/or writing functions while the trailing module can read any just-written data. Thus, these embodiments are preferred for write-read-write, read-write-read, and write-write-read applications. In the latter embodiments, closures should be wider than the tape canopies for ensuring read capability. The wider closures may require a wider gap-to-gap separation. Therefore, a preferred embodiment has a write-read-write configuration, which may use shortened closures that thus allow closer gap-to-gap separation.

Additional aspects of the embodiments shown in FIGS. 6 and 7 are similar to those given above.

A 32 channel version of a multi-module head 126 may use cables 350 having leads on the same or smaller pitch as current 16 channel piggyback LTO modules, or alternatively the connections on the module may be organ-keyboarded for a 50% reduction in cable span. Over-under, writing pair unshielded cables may be used for the writers, which may have integrated servo readers.

The outer wrap angles $\alpha_1$ may be set in the drive, such as by guides of any type known in the art, such as adjustable rollers, slides, etc. or alternatively by outriggers, which are integral to the head. For example, rollers having an offset axis may be used to set the wrap angles. The offset axis creates an orbital arc of rotation, allowing precise alignment of the wrap angle $\alpha_1$.

To assemble any of the embodiments described above, conventional u-beam assembly can be used. Accordingly, the mass of the resultant head may be maintained or even reduced relative to heads of previous generations. In other approaches, the modules may be constructed as a unitary body. Those skilled in the art, armed with the present teachings, will appreciate that other known methods of manufacturing such heads may be adapted for use in constructing such heads. Moreover, unless otherwise specified, processes and materials of types known in the art may be adapted for use in various embodiments in conformance with the teachings herein, as would become apparent to one skilled in the art upon reading the present disclosure.

Figure 8:
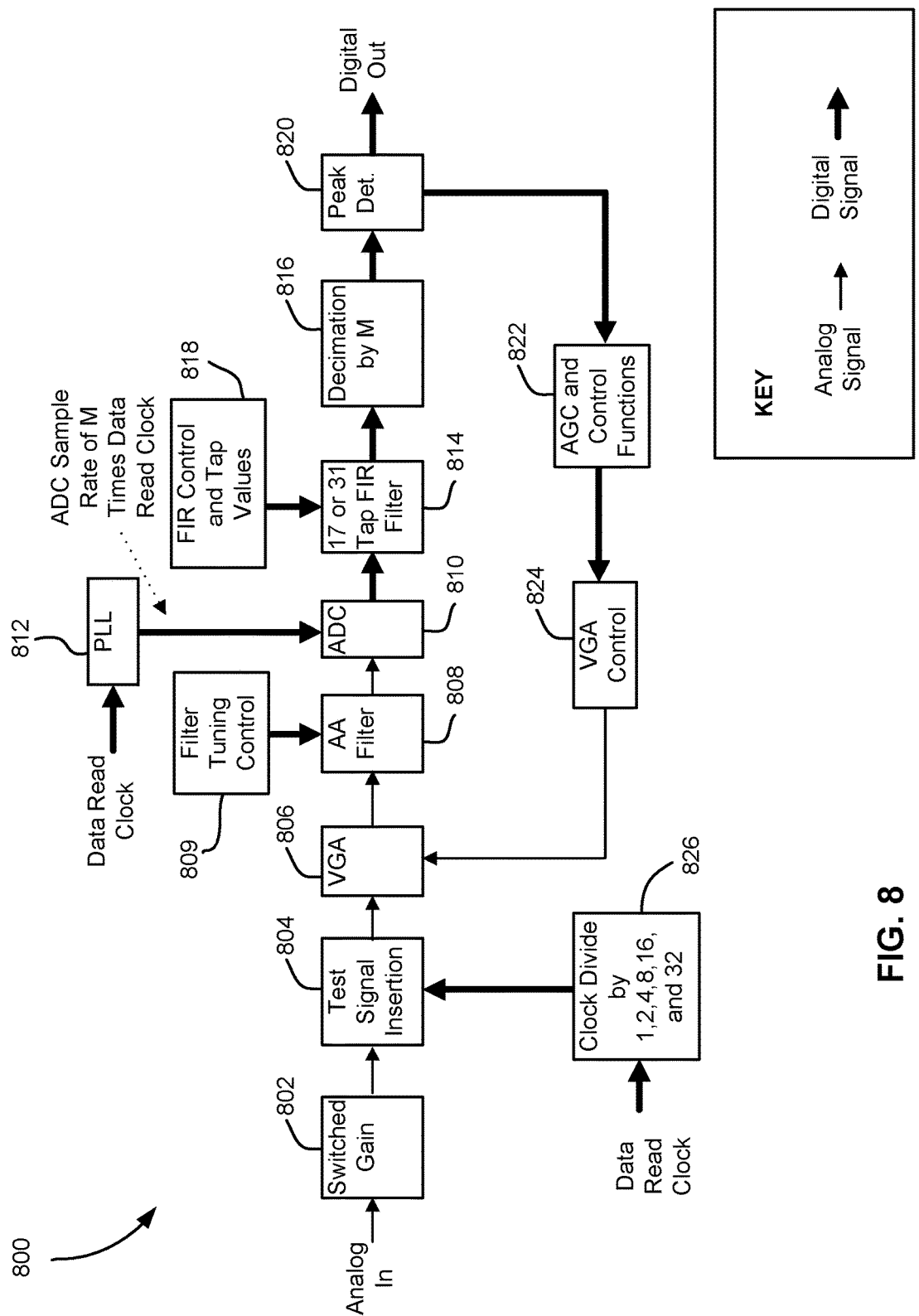
FIG. 8 depicts a signal processing circuit in accordance with one embodiment.

FIG. 8 depicts a signal processing circuit 800 in accordance with one embodiment. As an option, the present circuit 800 may be implemented in conjunction with features from any other embodiment listed herein, such as those described with reference to the other FIGS. For example, the circuit 800 may be implemented in the controller 128 of FIG. 1A as part of a read channel. Such controller may have 32, 64, or more read channels, each with such a circuit.

The circuit may be implemented in hardware, e.g., in an application specific integrated circuit (ASIC), a field programmable gate array (FPGA), etc., combinations thereof, or any other suitable configuration known in the art.

Of course, such circuit 800 and others presented herein, including variants thereof with more or less features than those shown, may be used in various applications and/or in permutations which may or may not be specifically described in the illustrative embodiments listed herein. Further, the circuit 800 presented herein may be used in any desired environment.

With continued reference to FIG. 8, during normal operation, a data analog signal (Analog In) is present at the input. The signal may pass through a switched gain module 802 of a type known in the art. The test signal insertion module 804, described in more detail below, is configured to allow the input signal to pass through the block unmodified. A Variable Gain Amplifier (VGA) 806 of conventional construction is used to control the signal level at the input of the AA filter 808. The AA filter 808 is configurable, under control of the filter tuning control module 809, and can be set to attenuate frequencies above some level.

In some embodiments, the AA filter 808 is able to change its cutoff frequency, above which frequencies are attenuated, to a cutoff frequency that is a fraction of the sample rate of the ADC 810. The fraction used in a given embodiment may depend on the particular implementation, as would be appreciated by one skilled in the art, and therefore the fraction may be any suitable value. For this example, assume the fraction is ½ in normal operation, and therefore the AA filter 808 is ideally set to attenuate frequencies above ½ the sample rate of the ADC 810. The sample rate of the ADC 810 may be set to M times the data read clock frequency. The value of M used in a given embodiment may depend on the particular implementation, as would be appreciated by one skilled in the art, and therefore M may be any suitable value. For this example, assume the value of M is 3.

The sample rate of the ADC 810 may be adjusted according to a sample clock signal, which can be generated according to any known method. In the embodiment shown, a data read clock signal (Data Read Clock) is fed into a Phase Lock Loop (PLL) 812, which is used in generating the sample clock signal. Again, the sample clock signal may be M times higher in frequency than the input data rate signal.

Where the data rate of the incoming analog signal (Analog In) varies, the data read clock signal may be correspond in some way to the variable data rate, as would be apparent to one skilled in the art. For example, in a magnetic tape recording implementation, where the tape speed changes during operation with a corresponding change in data rate, the data read clock frequency is changed to different values based on the physical tape speed in the drive. As the tape speed changes the data read clock frequency is changed but the ratio of the data read clock frequency to the AA filter cutoff remains constant. While the ratio and AA filter cutoff may each be any suitable value depending on the particular implementation, assume for this example that the AA filter upper cutoff is −3 dB, which corresponds to a ratio of 0.4. For example, if the data read clock is 100 MHz then the upper −3 dB point will be at 40 MHz.

The digital output of the ADC 810 is provided to a Finite Impulse Response (FIR) digital filter 814, which is configured as a low pass filter in normal operation to provide filtering of signals in the digital domain before decimation down by a factor of M by the decimation module 816. The FIR filter 814 may have any number of taps, and which taps are used may depend on the particular implementation of the circuit 800, as would be understood by one skilled in the art upon reading the present description. In the example shown, the FIR filter 814 may operate with 17 taps or 31 taps. For normal channel operation the FIR filter 814 may be configured with 17 taps and the rest are bypassed. This can be done to save power. Each tap may be programmable, e.g., under control of a FIR control module 818. Programming the taps enables programming of the FIR filter 814 to function as a low-pass, a band-pass, or a high-pass filter. The functionality is settable merely by changing the tap value(s). During normal use in a read channel of a tape drive, the FIR filter 814 is set up to be a low-pass filter, and may also provide an anti-aliasing function from a filtering standpoint, but in the digital domain.

At the decimation module, for example, if M is 3 according to the previous example, then for every 3 values that come in, one of the values is selected for output. Every $3^{rd}$ value may be output, for example.

A peak detector 820 determines the amplitude of the signal (Digital Out) output by the circuit 800. The AGC and Control Functions module 822 provides Automatic Gain Control (AGC) for the system by comparing the output of the peak detector 820 with a reference value to determine whether to turn the gain in the VGA 806 up or down to make the output move closer to the reference value. The reference value may be predefined, set by the apparatus in which the circuit is implemented, provided by firmware, etc. The AGC and Control Functions module 822 may also control the attack and decay times of the AGC system (e.g., how fast the gain is changed by the VGA 806) and the programmed reference value of the system which is compared with the output of the peak detector 820.

When the gain of the VGA 806 needs to increase or decrease to move the output signal level closer to the reference value, the AGC and Control Functions module 822 may cause the output of the VGA Control module 824 to increase or decrease the gain of the VGA 806. The AGC and Control Functions module may also have the capability to set a fixed gain that can be programmed to a desired VGA gain. The VGA control module 824 provides the interface from the digital domain to the analog domain to control the gain of the VGA 806.

In a multi-channel system, such as a tape drive capable of simultaneously reading multiple data tracks from a magnetic recording tape, each read channel may have a circuit such as circuit 800.

In normal operation, the circuit 800 may function primarily as noted above. The test signal insertion module 804 is configured to pass the analog signal through during normal operation.

As noted above, it may be desirable to calibrate the AA filter and/or verify that it has the proper settings. Various embodiments make use of the programmability of the blocks in a circuit such as that shown in FIG. 8, and the ability to inject a symmetrical square wave to aid in the adjustment and/or verification of the AA filter cutoff frequency point by measuring the amplitude of the signal at different frequencies in the digital domain. Moreover, if the FIR filter 814 is programmable, it may be used during the calibration and/or verification by temporarily configuring the FIR filter 814 as a band pass filter, instead of as a low pass filter used in data signal processing.

Figure 9:
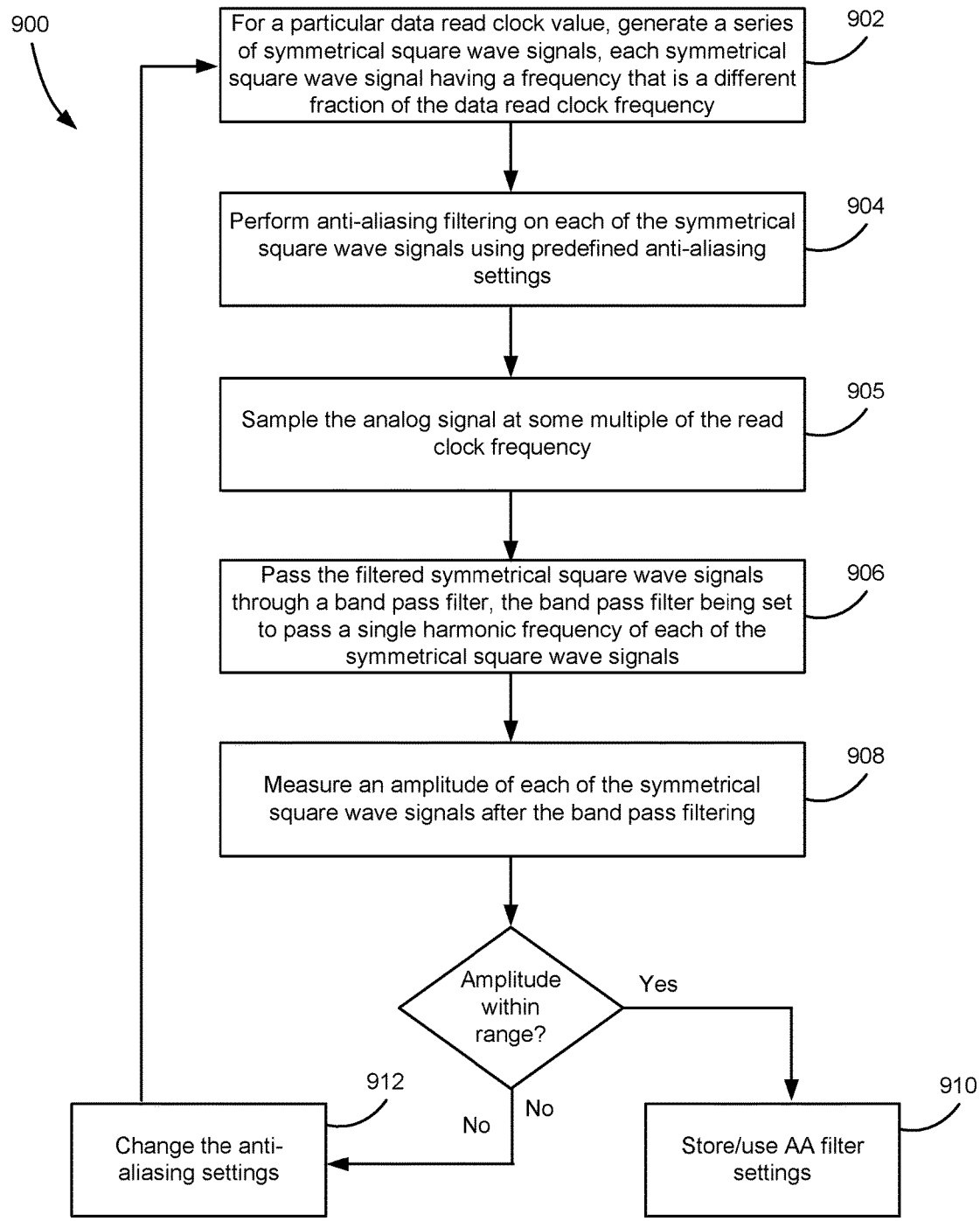
FIG. 9 is a flowchart of a method for calibrating an AA filter, according to one embodiment.

Now referring to FIG. 9, a flowchart of a method 900 for calibrating an AA filter is shown according to one embodiment. The method 900 may be performed in accordance with the present invention in any of the environments depicted in FIGS. 1-8 and 10, among others, in various embodiments.

Of course, more or less operations than those specifically described in FIG. 9 may be included in method 900, as would be understood by one of skill in the art upon reading the present descriptions.

Each of the steps of the method 900 may be performed by any suitable component of the operating environment. For example, in various embodiments, the method 900 may be partially or entirely performed by a controller such as controller 128 of FIG. 1A, or some other device having one or more processors therein. The processor, e.g., processing circuit(s), chip(s), and/or module(s) implemented in hardware and/or software, and preferably having at least one hardware component may be utilized in any device to perform one or more steps of the method 900. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 9, method 900 may initiate with operation 902, where, for a particular data read clock value (e.g., clock rate), a series of symmetrical square wave signals are generated. Each symmetrical square wave signal has a frequency that is a different fraction of the data read clock frequency. Test signals of at least two frequencies should be generated. Preferably test signals at more than two frequencies are generated.

Referring to FIG. 8 by way of example only, a clock divider 826 and test signal insertion module 804 may be used to generate the square wave signals at each of the desired frequencies. Particularly, the test signal insertion module 804 is controlled to allow injection of a digital square wave that is some sub-multiple (fraction) of the data read clock frequency. The clock divider 826 divides the data read clock by some value, e.g., 1, 2, 4, 8, 16, and/or 32. For example if the data read clock frequency is 100 MHz and the clock divider 826 is set to 4, the resulting test frequency is 25 MHz. What is unique about these numbers is that the output of the clock divider 826 is symmetrical, in that its high and low values are exactly the same period of time; it is a square wave. A square wave is preferred because it will generally have, in the frequency domain, only odd components, i.e., $1^{st}$ harmonic, $3^{rd}$ harmonic, $5^{th}$ harmonic, $7^{th}$ harmonic, and so on. This fact can be used to examine the amplitude of the sampled wave form using the AGC and Control Functions module 822 of FIG. 8 in combination with the FIR filter 814 configured as a band pass filter.

With continued reference to FIG. 9, in operation 904, anti-aliasing filtering is performed on each of the symmetrical square wave signals using predefined anti-aliasing settings. The predefined anti-aliasing settings may be default settings, may be defined by the system or a user, may be values from a previous calibration and retrieved from memory, etc. Preferably, where AGC is present as in FIG. 8, an automatic gain control level is established and the automatic gain control loop is locked prior to performing the anti-aliasing filtering on each of the symmetrical square wave signals. The VGA control module 824 may lock the automatic gain control loop in the circuit 800 of FIG. 8.

In operation 905, the analog signal is sampled at some multiple of the read clock frequency. In operation 906, the filtered symmetrical square wave signals are preferably digitized (e.g., via ADC 810 of FIG. 8) and passed through a band pass filter. The band pass filter is set to pass a single harmonic frequency of each of the symmetrical square wave signals. The single frequency may be the first, third, fifth, etc. harmonic frequency. In a preferred embodiment, the band pass filter is set to pass the first harmonic frequency of each of the symmetrical square wave signals.

A discrete band pass filter may be used, or existing hardware configured to provide the band pass filtering function. For example, as noted above, the FIR filter 814 in the exemplary circuit 800 of FIG. 8 can be configured as a band pass filter by changing the tap values of the FIR filter 814. The FIR filter 814 can be configured as a band pass filter by changing the tap values of the FIR filter 814. The FIR filter 814 in the example shown in FIG. 8 is configured to allow the use of 17 taps or 31 taps depending on the measurement to be made. A 31 tap mode may be used during the verification/calibration process. However, for normal channel operation, the FIR may be configured with 17 taps, bypassing the rest of the taps to save power.

Decimation of the signal output from the band pass filter may be performed, e.g., by the decimation module 816.

In operation 908 of FIG. 9, an amplitude of each of the symmetrical square wave signals is measured after the band pass filtering. In the exemplary embodiment of FIG. 8, the peak detector 820 can be used to measure what the amplitude of the wave form, e.g., at the fundamental frequency, the $3^{rd}$ harmonic, etc.

In response to the amplitudes of the symmetrical square wave signals being within a predefined range, the present AA settings may be stored, e.g., in memory, for immediate and/or future use. Note operation 910 of FIG. 9.

In response to the amplitudes of the symmetrical square wave signals being outside the predefined range, the AA settings may be changed, and the method 900 repeated. Note operation 912. In a preferred approach, the AA settings may be changed to a value expected to improve attenuation. An algorithm may be used to select new AA settings. For example, the AA settings may be stepped through a predefined sequence of values. In another approach, the AA settings may be adjusted in one direction, and if improvement in attenuation is detected, further adjustment in that direction may be performed. If deterioration is detected, adjustment may be made in the opposite direction. In another embodiment, the AA settings may be changed randomly or semi-randomly until desirable attenuation is obtained.

Referring again to FIG. 8, the AGC and control functions module 822 may receive the amplitude detected by the peak detector 820 and then make a decision about whether the amplitude is what is desired or that the amplitude is a different value, implying that the AA filter 808 should be tuned to provide the desired attenuation. Module 822 may perform operations 910 and 912 of FIG. 9.

The method 900 may be performed for each data read clock rate of interest. For example, in a tape drive in which the data read clock rate varies with the speed of the tape, the method may be performed for some or all data read clock rates expected to be used by the drive.

Once the method 900 is complete and the desired AA filter settings have been verified and/or determined, the AA settings may be stored and/or used for data signal processing operations.

Figure 10:
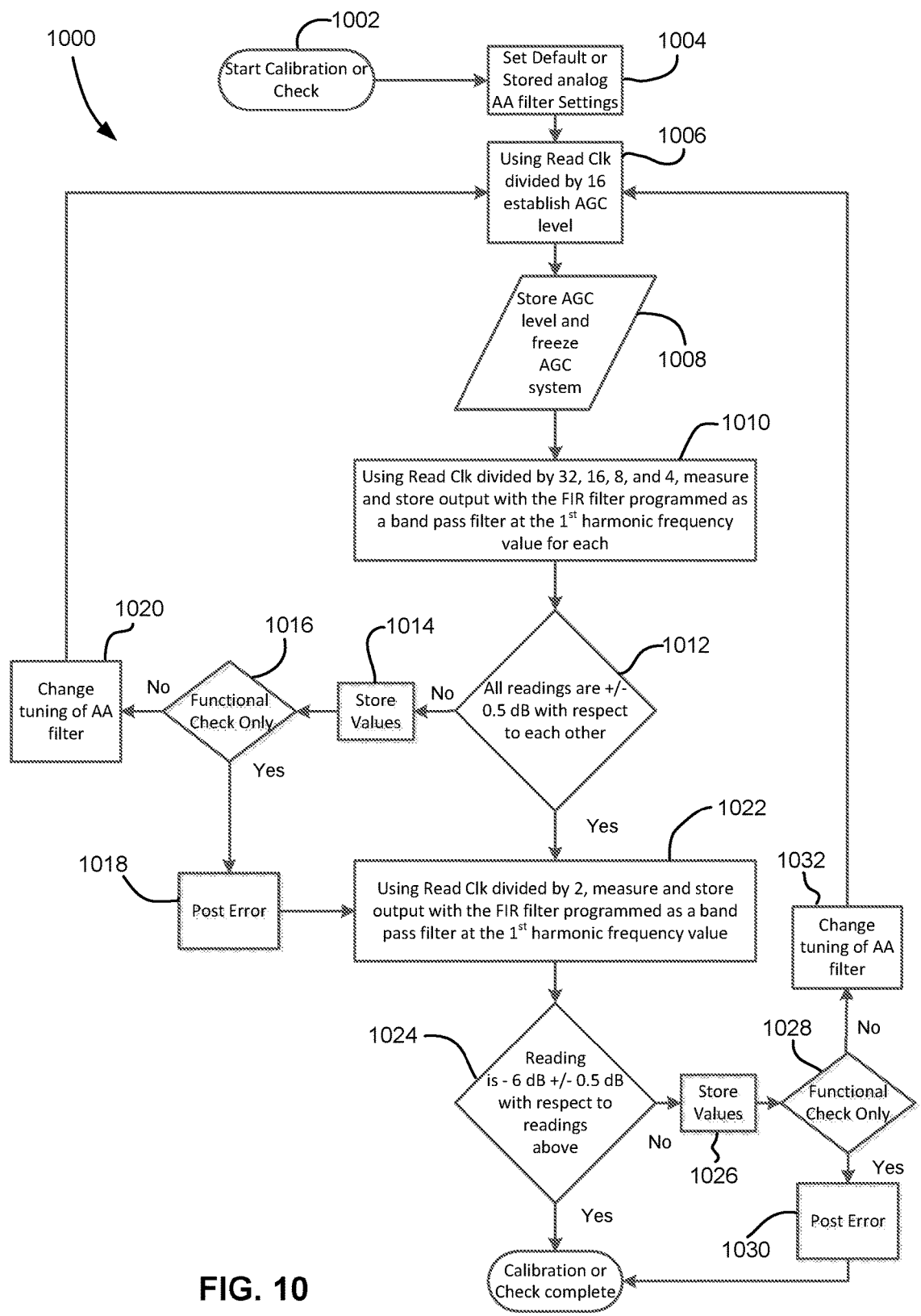
FIG. 10 is a flowchart of a method for verifying and/or calibrating an AA filter, according to one embodiment.

Now referring to FIG. 10, a flowchart of a method 1000 for verifying and/or calibrating an AA filter is shown according to one embodiment. This method 1000 is particularly usable with a circuit such as that shown in FIG. 8. However, aspects of the method 1000 may be performed in accordance with the present invention in any of the environments depicted in FIGS. 1-9, among others, in various embodiments. Of course, more or less operations than those specifically described in FIG. 10 may be included in method 1000, as would be understood by one of skill in the art upon reading the present descriptions.

Each of the steps of the method 1000 may be performed by any suitable component of the operating environment. For example, in various embodiments, the method 1000 may be partially or entirely performed by a controller such as controller 128 of FIG. 1A, or some other device having one or more processors therein. The processor, e.g., processing circuit(s), chip(s), and/or module(s) implemented in hardware and/or software, and preferably having at least one hardware component may be utilized in any device to perform one or more steps of the method 1000. Illustrative processors include, but are not limited to, a central processing unit (CPU), an application specific integrated circuit (ASIC), a field programmable gate array (FPGA), etc., combinations thereof, or any other suitable computing device known in the art.

In operation 1002, the process begins.

In operation 1004, the AA filter settings are set. As above, the initial AA filter settings may be default settings, settings acquired via a previous calibration process, settings input by a user, etc.

In operation 1006, the AGC level is established using the data read clock divided by some value. Assuming by way of example only that the AA filter cutoff is −3 dB, dividing the data read clock by 16, as shown, generates a frequency that is going to be well below the −3 dB point. The low frequency in turn allows the system to determine the gain of the system in band. That value of the gain may be stored. The AGC system is frozen at that level. See operation 1008. In other words, the AGC maintains the gain at that value independent of the amplitude of the signal at the input of the peak detector 820 in FIG. 8.

With continued reference to FIG. 10, in operation 1010, the read clock is divided by 32, 16, 8 and/or 4 and used to measure the output with the FIR filter set as a band-pass filter at the $1^{st}$ harmonic frequency value for each divided read clock value, if desired. For example, values may be captured for each of the four divided clock signals. This provides an indication of what the attenuation of the AA filter is. The system, e.g., via firmware, may store the resulting amplitudes corresponding to each applied clock value.

At decision 1012, the measured amplitudes are compared to determine whether they are within a range, in this example ±½ dB with respect to each other. Of course, this and other ranges presented herein may be set to any desired value, as would be apparent to one skilled in the art once being apprised of the present disclosure.

In response determining that the measured amplitudes are not within the range, the process continues to operation 1014, where the amplitude values are stored.

If the process 1000 is being performed as a functional check only, i.e., the process is not being performed to calibrate the AA filter, the process proceeds from decision 1016 to operation 1018, where an error is posted. If the process 1000 is being performed to calibrate the AA filter, the AA filter settings are changed in operation 1020 and stored before the process returns to operation 1006, where operations 1006-1012 are performed again with the new AA filter settings. This portion of the process may loop several times, until the desired AA filter attenuation is achieved. Process 1000 may have a predetermined maximum number of iterations of the attempts to adjust the filter before stopping.

Figure 11:
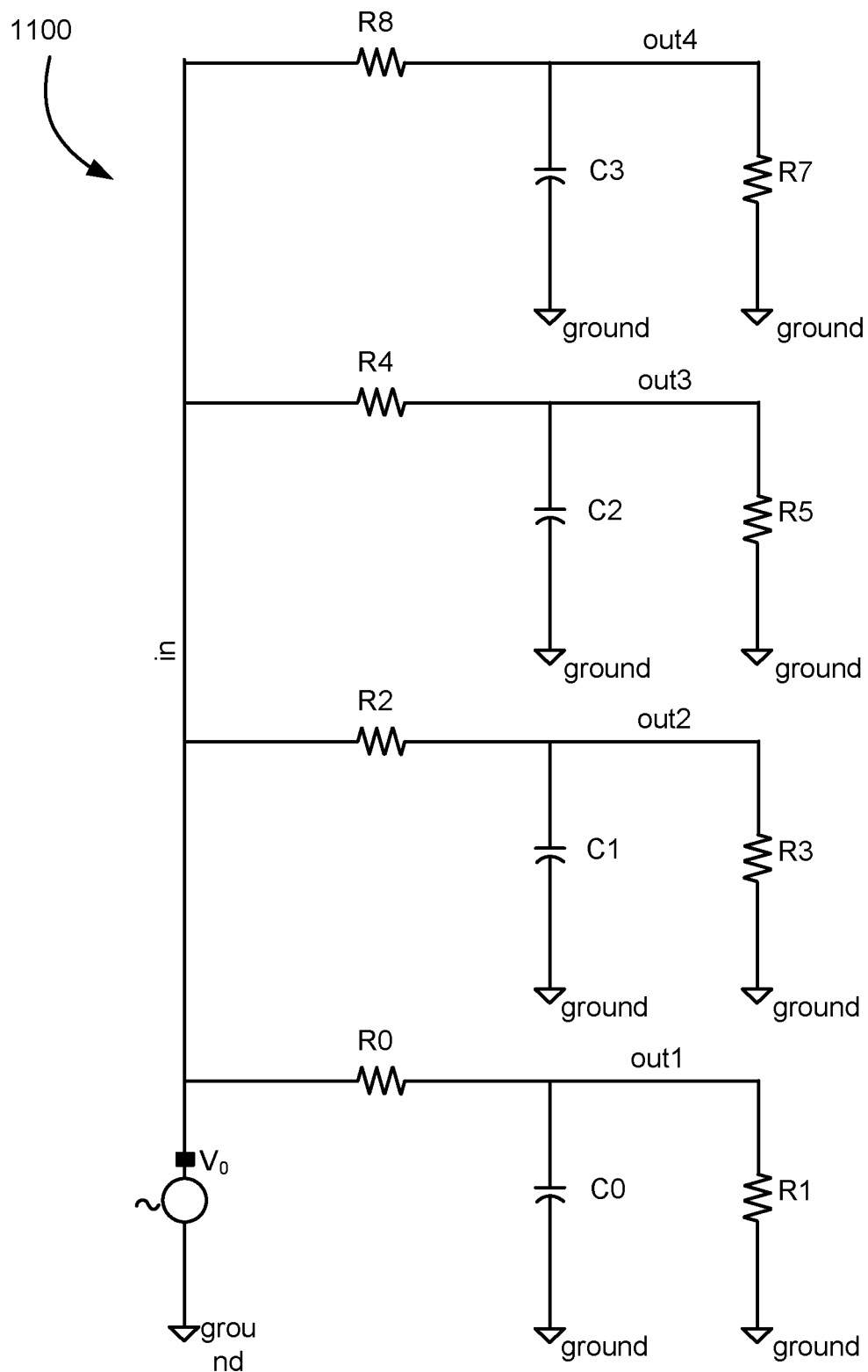
FIG. 11 depicts a circuit in accordance with one embodiment.

Any manner of selecting AA filter settings. FIG. 11 depicts an illustrative circuit 1100 to exemplify a very simple example of how to tune a circuit for a given gain below the −3 dB point and also tune its −3 dB frequency point, where the AA filter is to be set at −3 dB. Particularly, the circuit 1100 allows selecting the gain and the −3 dB point by changing the resistor values and/or the capacitor value. In this simple circuit 1100, by changing the value of R0, R2, R4, and R8 with respect to R1, R3, R5, R7 you can control the gain of the circuit at low frequencies. By changing the values of C0, C1, C2, and C3 with respect to the values of the resistors, the circuit can control where the signal is −3 dB below the low frequency gain. For this example, the gain of the circuit at low frequencies may be increased by decreasing the value of R0, R2, R4, and R8 or increasing the value of R1, R3, R5, and R7. To decrease the −3 dB frequency point, increase the value of C0, C1, C2, or C3. To increase the −3 dB frequency point, decrease the value of C0, C1, C2, or C3.

Referring again to FIG. 10, the foregoing operations verify and/or calibrate the AA filter in the band of interest. The following operations verify and/or calibrate the AA filter outside the band of interest.

In response to determining that the measured amplitudes are within the range at operation 1012, the process continues to operation 1022, where the data read clock divided by 2 is used to measure and store output with the FIR filter programmed as a band-pass at the $1^{st}$ harmonic value.

At decision 1024, the amplitude acquired in operation 1022 is compared to the amplitudes acquired in operation 1010 to determine whether they are within a range, in this example −6 dB±½ dB with respect to each other. Of course, this and other ranges presented herein may be set to any desired value, as would be apparent to one skilled in the art once being apprised of the present disclosure.

Consider the example again where the AA filter cutoff is desired to be −3 dB. The test signals are square wave, there will be a roll-off in the channel. The roll-off in the channel is before the anti-aliasing filter and is of a relatively wide band-width. The anti-aliasing filter is essentially what is limiting the bandwidth of the system. The data channel clock is related to the frequency of the desired roll-off. Accordingly, the ratio of the anti-aliasing filter cut-off corresponding to the −3 dB point is approximately 0.4 times the value of the read clock frequency. That ratio is constant, e.g., whether the read clock is 100 MHz or 20 MHz. It follows that the −3 dB rolloff should be 0.4 of 100 MHz or 0.4 of 20 MHz, and this knowledge may be used to tune the anti-aliasing filter. Then, for example, if the read clock is 100 MHz and is divided by 2, the result is 50 MHz, which is slightly above the −3 dB point. However, when dividing by 4, 16, or 32 the result is well inside where the −3 dB point is. Accordingly, the looking at frequencies corresponding to the divisors 32, 16, 8, and 4, the resultant frequencies are lower than where the −3 dB point of the anti-aliasing filter should be, so they should not be attenuated by that much; thus, all resulting values should be within a ½ dB of one another when the AA filter is set properly.

On the other hand, when the read clock is divided by 2, the frequency should be outside this −3 dB point, and it for the AA filter in this example, it should be about −6 dB down. Therefore, the comparison here uses −6 dB±½ dB, which corresponds to the tolerance of the exemplary system.

Returning to FIG. 10, in response determining that the measured amplitudes are within the range in operation 1024, the process ends.

In response determining that the measured amplitudes are not within the range, the process continues to operation 1026, where the amplitude values are stored.

If the process 1000 is being performed as a functional check only, the process proceeds from decision 1028 to operation 1030, where an error is posted. If the process 1000 is being performed to calibrate the AA filter, the AA filter settings are changed in operation 1032 and the process returns to operation 1006, where operations 1006-1024 are performed again with the new AA filter settings. This portion of the process may loop several times, until the desired AA filter attenuation is achieved.

The method 1000 may be performed for each data read clock rate of interest. For example, in a tape drive in which the data read clock rate varies with the speed of the tape, the method may be performed for some or all data read clock rates expected to be used by the drive. Using the example above, the AA filter −3 dB cutoff frequencies may be set to the correct value each physical tape speed and read clock value.

Once the method 1000 is complete and the desired AA filter settings have been verified and/or determined, the AA settings may be stored and/or used for data signal processing operations.

Figure 12:
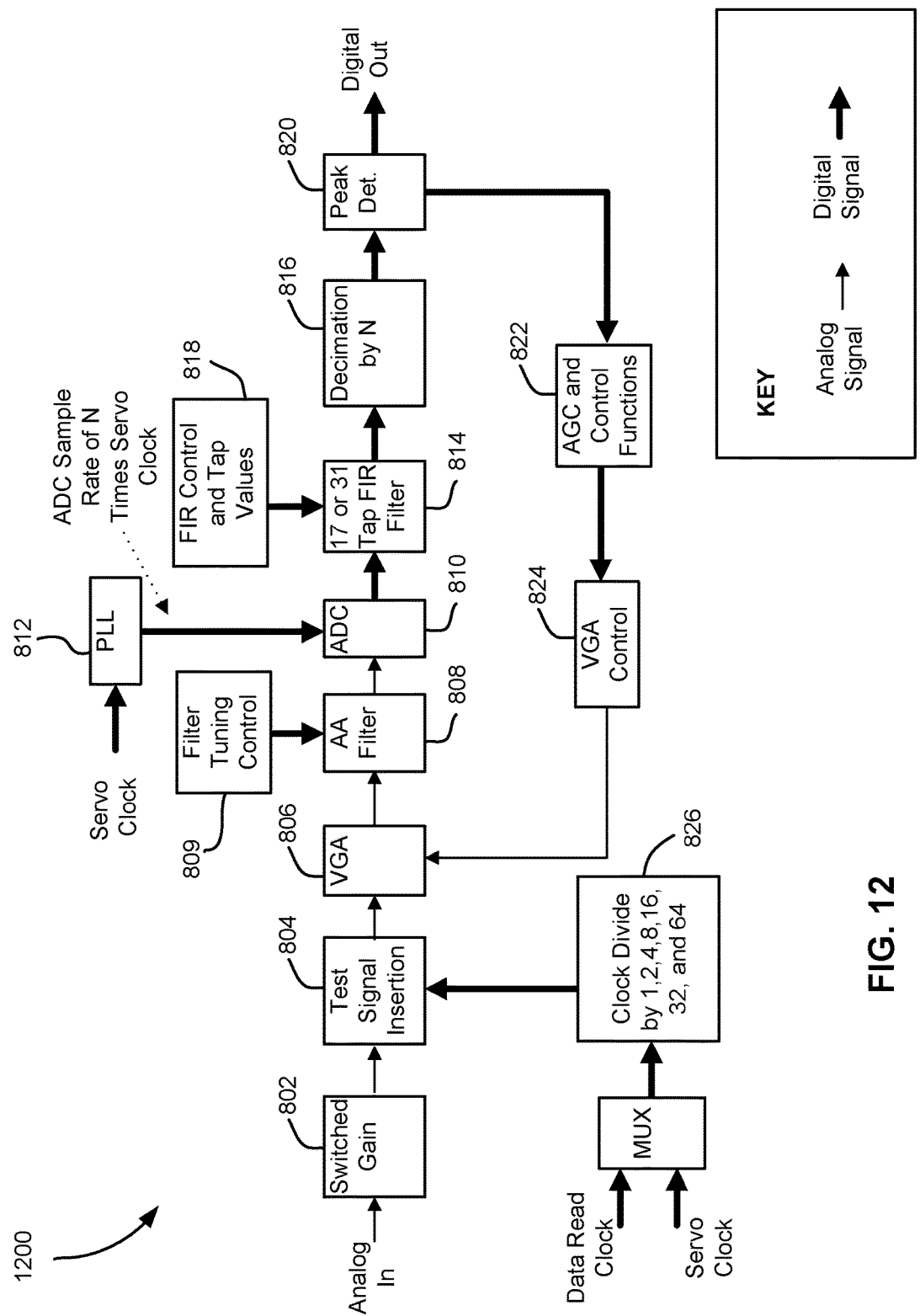
FIG. 12 depicts a servo signal processing circuit in accordance with one embodiment.

FIG. 12 depicts a servo signal processing circuit 1200 in accordance with one embodiment. As an option, the present circuit 1200 may be implemented in conjunction with features from any other embodiment listed herein, such as those described with reference to the other FIGS. For example, the circuit 1200 may be implemented in the controller 128 of FIG. 1A as part of a read channel. Such controller may have 2, 4, 6 more servo channels, each with such a circuit.

The circuit may be implemented in hardware, e.g., in an application specific integrated circuit (ASIC), a field programmable gate array (FPGA), etc., combinations thereof, or any other suitable configuration known in the art.

Of course, such circuit 1200 and others presented herein, including variants thereof with more or less features than those shown, may be used in various applications and/or in permutations which may or may not be specifically described in the illustrative embodiments listed herein. Further, the circuit 1200 presented herein may be used in any desired environment.

The servo signal processing circuit 1200 may have similar or the same components as circuit 800 of FIG. 8, and therefore common numbering is used. Features unique to the servo signal processing circuit 1200 are described below. Features not described below may be as described above with reference to FIG. 8.

Referring to FIG. 12, in normal operation the analog timing based servo (TBS) signal (Analog In) is received at the input. The Test Signal Insertion block 804 is configured to pass the TBS signal through to the VGA 806. The cutoff of the AA filter 808 is set to some value between the $4^{th}$ and $8^{th}$ harmonic of the fundamental TBS signal. With the range in tape speed in the drive, the fundamental frequency can vary between 1 MHz and 2.4 MHz.

Typically, the servo clock frequency is not changed as a function of tape speed. However, the TBS signal frequencies received at the input of the TBS channel change as a function of the tape speed. Therefore, the AA filter 808 cutoff frequencies for each tape speed should be set to the correct value.

The servo clock is the input to the PLL 812, and the output of the PLL is N-times the servo clock rate. N is typically a different value than M, but may be derived in similar ways as M, as described above.

A multiplexer (MUX) allows selection of either the data read clock or the servo clock to allow selection of the appropriate clock to work with the frequencies used in the particular calibration or functional check.

Figure 13:
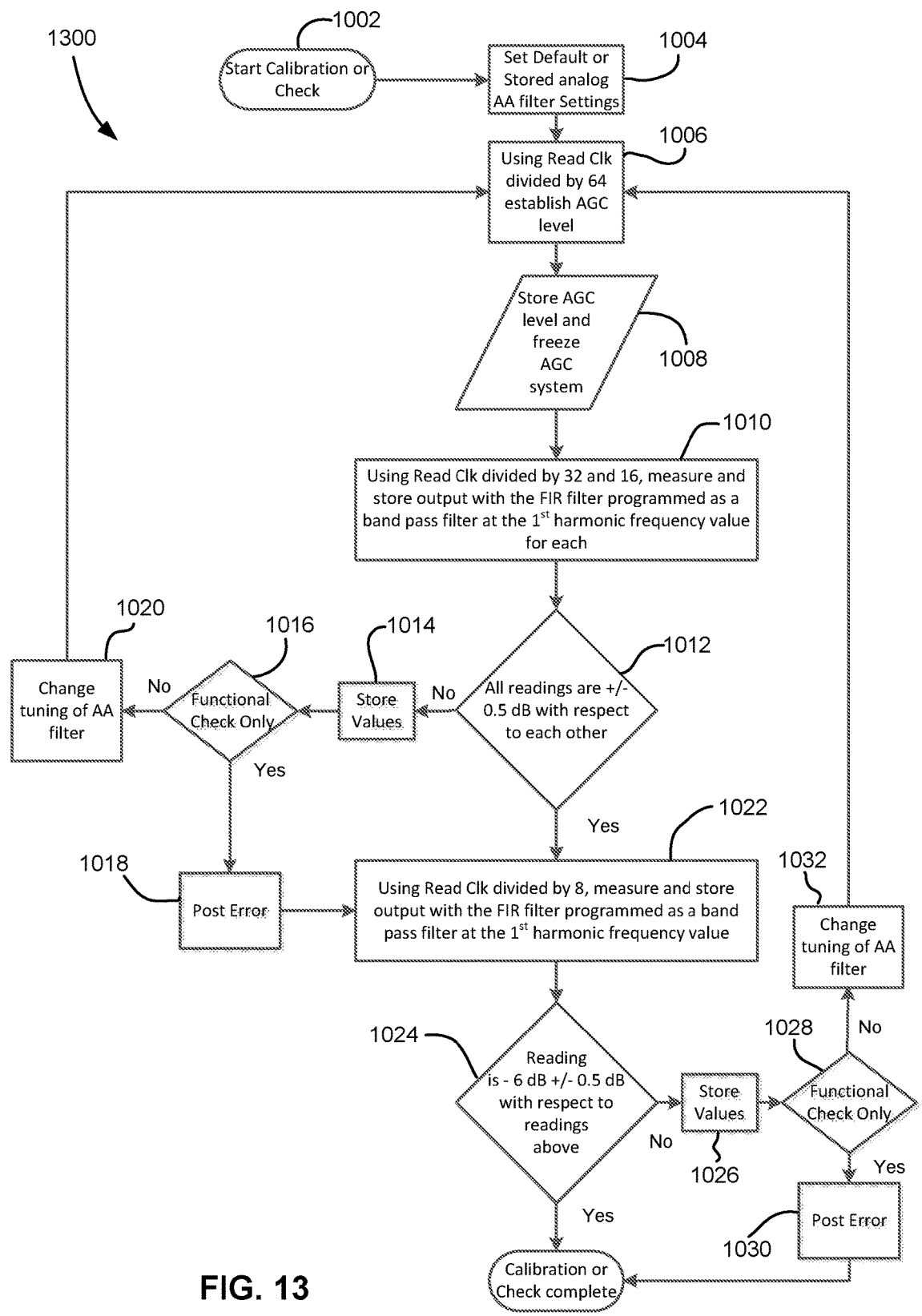
FIG. 13 is a flowchart of a method for verifying and/or calibrating an AA filter in a servo signal processing circuit, according to one embodiment.

Now referring to FIG. 13, a flowchart of a method 1300 for verifying and/or calibrating an AA filter in a servo signal processing circuit is shown according to one embodiment. This method 1300 is particularly usable with a circuit such as that shown in FIG. 12. However, aspects of the method 1300 may be performed in accordance with the present invention in any of the environments depicted in FIGS. 1-11, among others, in various embodiments. Of course, more or less operations than those specifically described in FIG. 13 may be included in method 1300, as would be understood by one of skill in the art upon reading the present descriptions.

Each of the steps of the method 1300 may be performed by any suitable component of the operating environment. For example, in various embodiments, the method 1300 may be partially or entirely performed by a controller such as controller 128 of FIG. 1A, or some other device having one or more processors therein. The processor, e.g., processing circuit(s), chip(s), and/or module(s) implemented in hardware and/or software, and preferably having at least one hardware component may be utilized in any device to perform one or more steps of the method 1300. Illustrative processors include, but are not limited to, a central processing unit (CPU), an application specific integrated circuit (ASIC), a field programmable gate array (FPGA), etc., combinations thereof, or any other suitable computing device known in the art.

The servo signal processing circuit calibration method 1300 may have similar or the same components as method 1000 of FIG. 10, and therefore common numbering is used. Features unique to the servo signal processing circuit calibration method 1300 are described below. Features not described below and/or having a different description may be as described above with reference to FIG. 10.

The calibration procedures set forth herein may be performed according to any desired schedule, e.g., at first use, at random, each time the drive is restarted or reset, periodically, in response to detecting an error or increase in error rate, after a predetermined amount of data is processed, after a predetermined amount of tape has run, etc. For example, in a tape drive, calibration for each tape speed does not need to be performed every time the tape speed is changed. The firmware of the drive can direct a calibration of the analog AA filter based on a schedule taking into account the time and use since the last calibration. The analog AA filter settings are preferably stored by the drive firmware for use in setting the cutoff frequency. Because the components used for the calibration are located in the channel, the process for each of the data tracks can be done in parallel. This reduces the time required for the calibration process. Because all of the channels are on the same IC module, not all of the channels need to be calibrated, in some embodiments. For example, the on chip tracking of functions on the same die may be advantageously leveraged. One possibility may be calibrating every other channel. Another possibility may be to calibrate all of the channels initially, and based on the resulting values, determine how many channels need to be calibrated in the future for the chip. Any of these approaches reduces the calibration time of the channels.

The functional check, being faster, may be run more frequently, e.g., each time the circuit starts, each time a new tape cartridge is loaded into the drive, etc.

An advantage of various embodiments, e.g., methods 900, 1000 and/or 1300 is that, in some approaches, very little additional circuitry is required for the calibration process. This provides a significant advantage over other contemplated attempts that would appear to require much additional circuitry.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A computer-implemented method, comprising:
    performing anti-aliasing filtering on each of a plurality of symmetrical square wave signals, each symmetrical square wave signal having a frequency that is a different fraction of a frequency of a data read clock;
    passing the filtered symmetrical square wave signals through a band pass filter;
    measuring an amplitude of each of the symmetrical square wave signals after the band pass filtering;
    in response to the amplitudes of the symmetrical square wave signals being within a predefined range, storing anti-aliasing settings used during the anti-aliasing filtering; and
    in response to the amplitudes of the symmetrical square wave signals being outside the predefined range, changing the anti-aliasing settings.

2. A method as recited in claim 1, comprising establishing an automatic gain control level and locking an automatic gain control loop prior to performing the anti-aliasing filtering on each of the symmetrical square wave signals.

3. A method as recited in claim 1, wherein the symmetrical square wave signals are generated at at least two different frequencies corresponding to the data read clock divided by integers selected from a group consisting of 4, 8, 16 and 32.

4. A method as recited in claim 3, wherein the symmetrical square wave signals are generated at all four different frequencies corresponding to the data read clock divided by 4, 8, 16 and 32.

5. A method as recited in claim 3, comprising, prior to performing the anti-aliasing filtering on each of the symmetrical square wave signals: establishing an automatic gain control level using a symmetrical square wave signal are generated at a frequency corresponding to the data read clock divided by 16, and locking an automatic gain control loop prior to performing the anti-aliasing filtering on each of the symmetrical square wave signals.

6. A method as recited in claim 1, wherein the band pass filter is set to pass the first harmonic frequency of each of the symmetrical square wave signals.

7. A method as recited in claim 1, wherein the band pass filter is a FIR filter configured to function as the band pass filter.

8. A method as recited in claim 1, comprising, in response to the amplitudes of the symmetrical square wave signals being within a predefined range:
for the particular data read clock value, generating a symmetrical square wave signal having a frequency that is one half of the data read clock frequency;
performing anti-aliasing filtering on the symmetrical square wave signal having the frequency that is one half of the data read clock frequency;
passing the filtered symmetrical square wave signal having the frequency that is one half of the data read clock frequency through the band pass filter, the band pass filter being set to pass a single harmonic frequency of the symmetrical square wave signal having the frequency that is one half of the data read clock frequency;
after the band pass filtering, measuring an amplitude of the symmetrical square wave signal having the frequency that is one half of the data read clock frequency;
in response to the amplitude of the symmetrical square wave signal having the frequency that is one half of the data read clock frequency being within a second predefined range, storing the anti-aliasing settings; and
in response to the amplitude of the symmetrical square wave signal having the frequency that is one half of the data read clock frequency being outside the second predefined range, changing the anti-aliasing settings and repeating the method.

9. A method as recited in claim 1, comprising repeating the method for each of a plurality of data read clock values.

10. A method as recited in claim 9, wherein the plurality of data read clock values correspond to physical tape speeds.

11. An apparatus having a hardware-based controller configured to perform the method of claim 1.

12. The apparatus as recited in claim 11, comprising a drive mechanism for passing a magnetic medium over a magnetic head, the controller being electrically coupled to the magnetic head.

13. A computer program product for calibrating an anti-aliasing filter, the computer program product comprising a computer readable storage medium having program instructions embodied therewith, wherein the computer readable storage medium is not a transitory signal per se, the program instructions executable by a processing circuit to cause the processing circuit to perform a method comprising:
performing, by the processing circuit, anti-aliasing filtering on each of a plurality of symmetrical square wave signals, each symmetrical square wave signal having a frequency that is a different fraction of a frequency of a data read clock;
passing, by the processing circuit, the filtered symmetrical square wave signals through a band pass filter;
measuring, by the processing circuit, an amplitude of each of the symmetrical square wave signals after the band pass filtering;
in response to the amplitudes of the symmetrical square wave signals being within a predefined range, storing anti-aliasing settings used during the anti-aliasing filtering; and
in response to the amplitudes of the symmetrical square wave signals being outside the predefined range, changing the anti-aliasing settings.

14. A computer program product as recited in claim 13, comprising program instructions executable by the processing circuit to cause the processing circuit to establish an automatic gain control level and lock an automatic gain control loop prior to performing the anti-aliasing filtering on each of the symmetrical square wave signals.

15. A computer program product as recited in claim 13, wherein the symmetrical square wave signals are generated at at least two different frequencies corresponding to the data read clock divided by integers selected from a group consisting of 4, 8, 16 and 32.

16. A computer program product as recited in claim 15, comprising program instructions executable by the processing circuit to cause the processing circuit to, prior to performing the anti-aliasing filtering on each of the symmetrical square wave signals: establishing an automatic gain control level using a symmetrical square wave signal are generated at a frequency corresponding to the data read clock divided by 16, and locking an automatic gain control loop prior to performing the anti-aliasing filtering on each of the symmetrical square wave signals.

17. A computer program product as recited in claim 13, wherein the band pass filter is set to pass the first harmonic frequency of each of the symmetrical square wave signals.

18. A computer program product as recited in claim 13, wherein the band pass filter is a FIR filter configured to function as the band pass filter.

19. A computer program product as recited in claim 13, comprising program instructions executable by the processing circuit to cause the processing circuit to, in response to the amplitudes of the symmetrical square wave signals being within a predefined range:
for the particular data read clock value, generate a symmetrical square wave signal having a frequency that is one half of the data read clock frequency;
perform anti-aliasing filtering on the symmetrical square wave signal having the frequency that is one half of the data read clock frequency;
pass the filtered symmetrical square wave signal having the frequency that is one half of the data read clock frequency through the band pass filter, the band pass filter being set to pass a single harmonic frequency of the symmetrical square wave signal having the frequency that is one half of the data read clock frequency;
after the band pass filtering, measure an amplitude of the symmetrical square wave signal having the frequency that is one half of the data read clock frequency;
in response to the amplitude of the symmetrical square wave signal having the frequency that is one half of the data read clock frequency being within a second predefined range, store the anti-aliasing settings; and
in response to the amplitude of the symmetrical square wave signal having the frequency that is one half of the data read clock frequency being outside the second predefined range, change the anti-aliasing settings and repeating the method.

20. A computer program product as recited in claim 13, comprising program instructions executable by the processing circuit to cause the processing circuit to repeat the method for each of a plurality of data read clock values.

* * * * *